US011902727B2

(12) United States Patent
Minervini et al.

(10) Patent No.: US 11,902,727 B2
(45) Date of Patent: Feb. 13, 2024

(54) INDUCTIVE ACOUSTIC FILTERS FOR ACOUSTIC DEVICES

(71) Applicant: Apple Inc., Cupertino, CA (US)

(72) Inventors: Anthony D. Minervini, Sunnyvale, CA (US); Peter C. Hrudey, San Mateo, CA (US); Gokhan Hatipoglu, Santa Clara, CA (US)

(73) Assignee: Apple Inc., Cupertino, CA (US)

( * ) Notice: Subject to any disclaimer, the term of this patent is extended or adjusted under 35 U.S.C. 154(b) by 3 days.

(21) Appl. No.: 17/670,387

(22) Filed: Feb. 11, 2022

(65) Prior Publication Data
US 2023/0262370 A1    Aug. 17, 2023

(51) Int. Cl.
*H04R 1/02*    (2006.01)
*H04R 1/08*    (2006.01)
*H04R 1/28*    (2006.01)
*B81B 7/02*    (2006.01)

(52) U.S. Cl.
CPC .............. *H04R 1/023* (2013.01); *B81B 7/02* (2013.01); *H04R 1/08* (2013.01); *H04R 1/2803* (2013.01); *H04R 1/2873* (2013.01); *B81B 2201/0257* (2013.01); *H04R 2499/11* (2013.01)

(58) Field of Classification Search
CPC . H04R 1/00; H04R 1/02; H04R 1/023; H04R 1/08; H04R 1/086; H04R 1/083; H04R 1/28; H04R 1/2803; H04R 1/2873; H04R 1/34; H04R 1/342; H04R 1/2823; H04R 1/2846; H04R 9/08; H04R 17/00; H04R 17/02; H04R 17/025; H04R 19/016; H04R 19/04; H04R 21/02; H04R 21/026; H04R 2499/11; H03R 2101/34; B81B 7/02; B81B 2201/0257
See application file for complete search history.

(56) References Cited

U.S. PATENT DOCUMENTS

| | | | |
|---|---|---|---|
| 6,167,910 B1* | 1/2001 | Chow | B81C 1/00119 |
| | | | 137/526 |
| 9,479,854 B2* | 10/2016 | Loeppert | H04R 1/086 |
| 10,165,694 B1 | 12/2018 | Werner et al. | |
| 10,555,091 B2* | 2/2020 | Perletti | B81C 1/00626 |
| 2008/0248841 A1 | 10/2008 | Foo | |
| 2014/0044297 A1 | 2/2014 | Loeppert | |
| 2014/0079252 A1 | 3/2014 | Klein | |
| 2014/0233756 A1* | 8/2014 | Inoda | H04R 1/38 |
| | | | 381/91 |
| 2016/0007107 A1* | 1/2016 | Reese | H04R 19/005 |
| | | | 381/174 |
| 2017/0041706 A1 | 2/2017 | Evans et al. | |
| 2017/0164084 A1 | 6/2017 | Vitt et al. | |
| 2018/0091883 A1* | 3/2018 | Howes | G10K 11/1787 |
| 2020/0255284 A1* | 8/2020 | Kueffner | H04R 19/005 |
| 2020/0382862 A1 | 12/2020 | Hrudey et al. | |

* cited by examiner

*Primary Examiner* — Thang V Tran
(74) *Attorney, Agent, or Firm* — BAKERHOSTETLER

(57) ABSTRACT

Aspects of the subject technology relate to inductive acoustic filters for acoustic devices. An inductive filter may include a substrate, an etched serpentine channel in a surface of the substrate and extending within the substrate from a first port in the substrate to a second port in the substrate. The inductive filter may also include a polymer cover layer adhesively attached to the surface of the substrate over the etched serpentine channel. The inductive filter may be positioned over an opening in a substrate of an acoustic module, such as a microphone module or a speaker module.

26 Claims, 12 Drawing Sheets

INDUCTIVE ACOUSTIC FILTERS FOR ACOUSTIC DEVICES

TECHNICAL FIELD

The present description relates generally to acoustic devices including inductive acoustic filters for acoustic devices.

BACKGROUND

Electronic devices such as computers, media players, cellular telephones, and other electronic equipment are often provided with acoustic components such as microphones. It can be challenging to integrate acoustic components into electronic devices, such as in compact devices including portable electronic devices.

BRIEF DESCRIPTION OF THE DRAWINGS

Certain features of the subject technology are set forth in the appended claims. However, for purpose of explanation, several aspects of the subject technology are set forth in the following figures.

DETAILED DESCRIPTION

Figure 1:
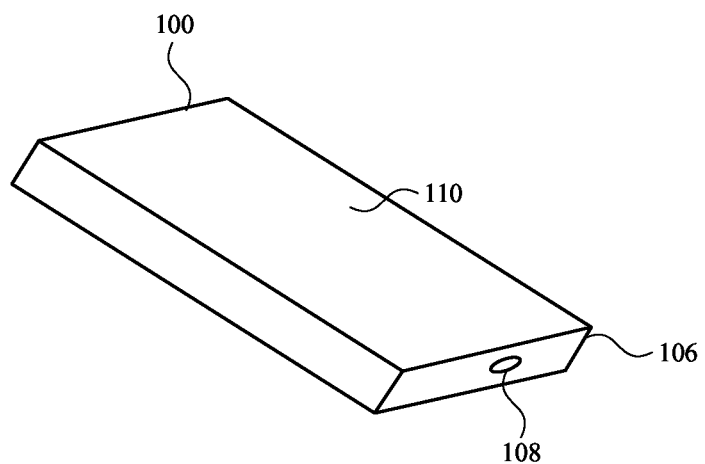
FIG. 1 illustrates a perspective view of an example electronic device having a microphone in accordance with various aspects of the subject technology.

The detailed description set forth below is intended as a description of various configurations of the subject technology and is not intended to represent the only configurations in which the subject technology may be practiced. The appended drawings are incorporated herein and constitute a part of the detailed description. The detailed description includes specific details for the purpose of providing a thorough understanding of the subject technology. However, it will be clear and apparent to those skilled in the art that the subject technology is not limited to the specific details set forth herein and may be practiced without these specific details. In some instances, well-known structures and components are shown in block diagram form in order to avoid obscuring the concepts of the subject technology.

Electronic devices such as desktop computers, televisions, set top boxes, internet-of-things (IoT) devices, and portable electronic devices including mobile phones, portable music players, smart watches, tablet computers, smart speakers, remote controllers for other electronic devices, headphones, earbuds, and laptop computers often include one or more sensors that respond to air movement and/or acoustic signals such as sound (e.g., from outside a housing of the device) to transduce a signal, and/or one or more components such as speakers that move air based on received signals. The sensors can include, as examples, acoustic sensors, which may include microphones for sound input to the device, pressure sensors, and/or ultrasonic sensors.

For example, a sensor such as a pressure sensor or an acoustic sensor, or any combination thereof, may be disposed within the housing of an electronic device and configured to receive input from outside the housing, in part due to airflow from outside the housing into the housing at various openings or ports. However, it can also be desirable to prevent liquid ingress into the housing of the electronic device and/or into a sensor module, such as a microphone module, an ultrasonic sensor module, a pressure sensor module, or any combination thereof. In some sensor modules, a porous membrane that allows airflow therethrough can be included to provide liquid resistance for the sensor module. To achieve low acoustic loss across a porous membrane, the porous membrane may be thin and compliant, which may generally cause the porous membrane to be less robust for high ingress pressures due to deep liquid (e.g., water) immersion, such as immersion at a depth of greater than about six meters.

In accordance with various aspects of the subject disclosure, a sensor module such as a microphone module or an ultrasonic sensor module may be provided with a non-porous membrane that extends over an acoustic port and prevents liquid ingress into the sensor module. For example, a non-porous membrane may be placed such that it forms a boundary between a front volume of a microphone module and an external environment of the microphone module, and prevents liquid and air ingress into the microphone module. To achieve low acoustic loss across a non-porous membrane, the non-porous membrane may be thin and relatively stiff, which may help provide more a robust membrane structure than a porous membrane, and which may be resistant to large liquid ingress pressures due to deep liquid (e.g., water) immersion to depths up to, for example, one hundred meters. However, while a (e.g., thin and relatively stiff) non-porous membrane may allow sound to pass through the membrane from the external environment to a sound-responsive element of the microphone module, the non-porous membrane may restrict or prevent airflow between the front volume and the external environment, which can be detrimental to the functioning of an acoustic component such as a microphone or an ultrasonic sensor.

In order, for example, to obtain the liquid-resistant benefits of a microphone module with a non-porous membrane over the acoustic port, while maintaining functionality of the microphone, the microphone module may be provided with a leak port to allow airflow into and out of the front volume that is sealed from the external environment by the non-porous membrane.

In one or more implementations, an opening may be provided in a substrate of a sensor module, such as a microphone module having a non-porous membrane. The opening may extend from a sealed volume that is on a first side of the substrate and that is fluidly coupled to the front volume and that is sealed by the non-porous membrane, to another environment external to the microphone module, such as an external environment on an opposing second side of the substrate. In one or more implementations, the sensor module having the non-porous membrane and the leak port may be implemented in an electronic device, such as a smart phone, a smart watch, a tablet device, or the like, having a housing that defines an interior volume in which the microphone module is disposed. In one or more implementations, the leak port through the substrate of the microphone module may fluidly couple the sealed volume on the first side of the substrate that is fluidly coupled to the front volume and that is sealed by the non-porous membrane, to the interior volume of the electronic device. In this way, the interior volume of the electronic device can act as an air reservoir for venting from the front volume of the microphone module. In one or more implementations, a resistive vent or resistive filter, and/or an inductive vent or inductive filter may be provided over the leak port to prevent sound from within the internal cavity from reaching a sound-responsive element of a microphone.

An illustrative electronic device including a sensor module such as a microphone module is shown in FIG. 1. In the example of FIG. 1, electronic device 100 has been implemented using a housing 106 that is sufficiently small to be portable and carried or worn by a user (e.g., electronic device 100 of FIG. 1 may be a handheld electronic device such as a tablet computer or a cellular telephone or smart phone, or a wearable device such as a smart watch, a headphone, or an earbud). In the example of FIG. 1, electronic device 100 includes a display such as display 110 mounted on the front of housing 106. Electronic device 100 includes one or more input/output devices such as a touch screen incorporated into display 110, a virtual or mechanical button or switch, and/or other input output components disposed on or behind display 110 or on or behind other portions of housing 106. Display 110 and/or housing 106 may form an enclosure within which components (e.g., one or more processors, volatile or non-volatile memory, a battery, one or more integrated circuits, one or more speakers, or other components) of the electronic device 100 are disposed. Display 110 and/or housing 106 may include one or more openings to accommodate a button, a switch, a speaker, a light source, a sensor such as a microphone, and/or a camera (as examples).

In the example of FIG. 1, housing 106 includes an opening 108 in the housing 106. In this example, opening 108 forms a port for a sensor, such as a microphone, that receives acoustic input, such as sound from the external environment outside of the housing 106. For example, opening 108 may form a sensor port for a sensor module disposed within housing 106, such as a microphone port for a microphone module disposed within housing 106, and/or an ultrasonic sensor port for an ultrasonic sensor disposed within housing 106. One or more additional openings in housing 106 and/or the display 110, though not explicitly shown in FIG. 1, may form a speaker port for a speaker disposed within the housing 106.

Opening 108 may be an open port or may be completely or partially covered with an air-permeable membrane and/or a mesh structure that allows air and sound to pass through the openings. Although one opening 108 is shown in FIG. 1, this is merely illustrative. One opening 108, two openings 108, or more than two openings 108 may be provided on the top edge and/or the bottom edge of housing 106, and/or one or more openings may be formed on sidewall (e.g., a left or right sidewall). Although opening 108 is depicted, in FIG. 1, on an edge of the housing 106, one or more additional openings for acoustic components and/or sensors may be formed on a rear surface of housing 106 and/or a front surface of housing 106 or display 110. In some implementations, one or more groups of openings 108 in housing 106 may be aligned with an acoustic port of an acoustic component and/or a sensor within housing 106.

Housing 106, which may sometimes be referred to as a case, may be formed of plastic, glass, ceramics, fiber composites, metal (e.g., stainless steel, aluminum, etc.), other suitable materials, or a combination of any two or more of these materials. In one example, housing 106 may be formed from a metal peripheral portion that runs (e.g., continuously or in pieces) around the periphery of electronic device 100 to form a top edge, a bottom edge, and sidewalls running therebetween, and/or a metal or glass rear panel mounted to the metal peripheral portion. In this example, an enclosure may be formed by the metal peripheral portion, the rear panel, and display 110, and device circuitry such as a battery, one or more processors, memory, application specific integrated circuits, sensors, antennas, acoustic components, and the like are housed within this enclosure.

However, it should be appreciated that the configuration of electronic device 100 of FIG. 1 is merely illustrative. In other implementations, electronic device 100 may be a computer such as a smart watch, a pendant device, or other wearable or miniature device, a media player, a gaming device, a navigation device, a computer monitor, a television, a headphone, or a somewhat larger device such as a computer that is integrated into a display such as a computer monitor, a laptop computer, or other electronic equipment.

For example, in some implementations, housing 106 may be formed using a unibody configuration in which some or all of housing 106 is machined or molded as a single structure or may be formed using multiple structures (e.g., an internal frame structure, one or more structures that form exterior housing surfaces, etc.). Although housing 106 of FIG. 1 is shown as a single structure, housing 106 may have multiple parts. For example, in other implementations, housing 106 may have upper portion and lower portion coupled to the upper portion using a hinge that allows the upper portion to rotate about a rotational axis relative to the lower portion. A keyboard such as a QWERTY keyboard and a touch pad may be mounted in the lower housing portion, in some implementations.

In some implementations, electronic device 100 may be provided in the form of a wearable device such as a smart watch. For example, in some implementations, housing 106 may include one or more interfaces for mechanically coupling housing 106 to a strap or other structure for securing housing 106 to a wearer. In some implementations, electronic device 100 may be a mechanical or other non-electronic device in which a microphone can be mounted within the housing, such as a pen or a support structure such as a monitor stand for a computer monitor. In any of these exemplary implementations, housing 106 includes an opening 108 associated with a microphone module. In some implementations, electronic device 100 may be provided in the form of a computer integrated into a computer monitor and/or other display, such as a television. Display 110 may be mounted on a front surface of housing 106 and optionally a stand may be provided to support the housing 106 (e.g., on a desktop) and/or housing 106 may be mounted on a surface, such as a wall.

Figure 2:
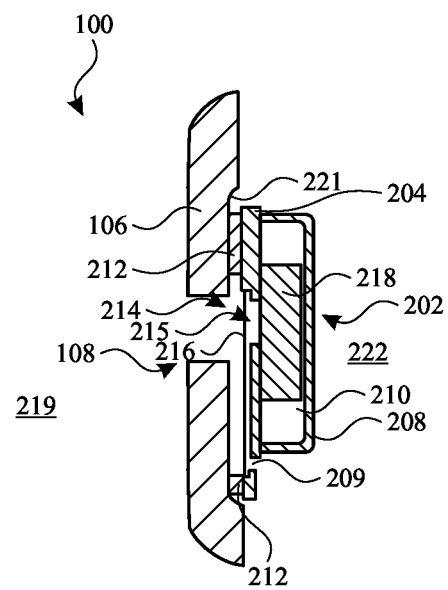
FIG. 2 illustrates a cross-sectional view of a portion of an electronic device including a vented liquid-resistant microphone adjacent to an opening in a housing of the device in accordance with various aspects of the subject technology.

A sensor module disposed within housing 106 receives sound through at least one associated opening 108. FIG. 2 shows a cross-sectional view of a portion of electronic device 100 in which a sensor module is mounted. For illustrative purposes, the sensor module is described herein in as being implemented as a microphone module 202. However, it should be appreciated that the microphone module 202 can be operable as another type of sensor module, such as an ultrasonic sensor module by providing a sound-responsive element that is responsive to acoustic signals with a frequency greater than 20 kilohertz.

In the example of FIG. 2, electronic device 100 includes a sensor module implemented as a microphone module 202 mounted within housing 106, adjacent to and aligned with an opening 108 in the housing 106. In this example, microphone module 202 is mounted to an interior surface 221 of housing 106, such as within an enclosure formed by the housing 106 and the display 110 of FIG. 1.

As shown, microphone module 202 may include a substrate 204 (e.g., a printed circuit board (PCB) substrate, such as a multi-layer PCB) attached to the interior surface 221, such as by adhesive 212. Adhesive 212 may be, for example, a sealing pressure sensitive adhesive (PSA), or another adhesive or attachment mechanism, that attaches substrate 204 to interior surface 221 such that the mounting interface is sealed against ingress of moisture or other contaminants into housing 106 via pathways between the substrate 204 and the interior surface 221. In the example of FIG. 2, an opening 215 (e.g., a first opening) in the substrate 204 is aligned with the opening 108 in housing 106 to allow sound to pass from an environment 219 external to the housing 106 to a sensor assembly 218 mounted on the substrate 204. In this way, sensor assembly 218 is in fluid and acoustic communication with the opening 215 in substrate 204 (and in acoustic communication with the opening 108 in the housing 106). Sensor assembly 218 may include, for example, a microelectromechanical systems (MEMS) microphone assembly having a moveable or flexible membrane that, when moved or flexed by incoming sound, causes the MEMS microphone to generate electrical signals corresponding to the incoming sound. As another example, the sensor assembly 218 may include a movable or flexible diaphragm attached to a voice coil in which a current is generated when the diaphragm moves and/or flexes. As discussed in further detail hereinafter, the sensor assembly 218 may include additional microphone circuitry coupled to the substrate 204.

As shown in FIG. 2, the sensor assembly 218 of microphone module 202 is disposed under a cover 208 (sometimes referred to as a lid, a can or a shield can) mounted on substrate 204 over the sensor assembly 218. In this configuration, a cavity formed between sensors assembly 218 and the cover 208 defines a back volume 210 of sensor assembly 218.

As shown in FIG. 2, the microphone module 202 may include a non-porous membrane 216. As shown, the non-porous membrane 216 may span across the opening 215 in the substrate and may fluidly separate a sealed volume within the microphone module from the environment 219 external to the housing 106 (e.g., on a first side of the substrate 204). For example, the non-porous membrane 216 may prevent air and fluid flow across the membrane, and still function as a low loss acoustic membrane. In the example of FIG. 2, the non-porous membrane 216 is mounted within a recess 214 in the substrate 204. As discussed in further detail hereinafter, the non-porous membrane 216 may seal a front volume of the microphone module from the environment 219 external to the housing 106. In this way, a liquid-resistant microphone module may be provided.

In order to, for example, provide venting for the liquid-resistant microphone module that has the non-porous membrane 216 sealing the front volume of the microphone from the environment 219, an opening 209 (e.g., a second opening) may be provided in the substrate 204. The opening 209 can provide a leak port from the front volume of the microphone module 202 to another environment external to the microphone module, such as an internal volume 222 of the electronic device 100. As shown in FIG. 2, the internal volume 222 within the electronic device 100, in which the microphone module 202 is implemented, may be separated from the back volume 210 by the cover 208. In this way, the internal volume 222 may be sealed from the back volume 210 and may function as an air reservoir for the microphone module 202.

In accordance with various implementations described herein, the microphone module 202 may also include various arrangements of resistive and/or inductive acoustic vents and/or filters over the opening 209 in the substrate 204, to allow air to flow through the opening 209 while preventing sound from leaking (e.g., from the internal volume 222) through the opening 209 to the sensor assembly 218. In one or more implementations, an additional leak path also can be provided through the substrate 204 from the front volume to the back volume 210.

In one or more implementations described in further detail hereinafter, a resistive vent can be provided at opening 209 in the substrate 204. In one or more implementations described in further detail hereinafter, an inductive vent can be provided at opening 209 in the substrate 204. The inductive vent can include a first port coupled to the front volume of the microphone module 202, a second port coupled to the opening 209 in the substrate 204, and a fluid pathway, such as a serpentine fluid pathway from the first port to the second port. Various implementations and arrangements of inductive and resistive vents are also disclosed herein.

Figure 3:
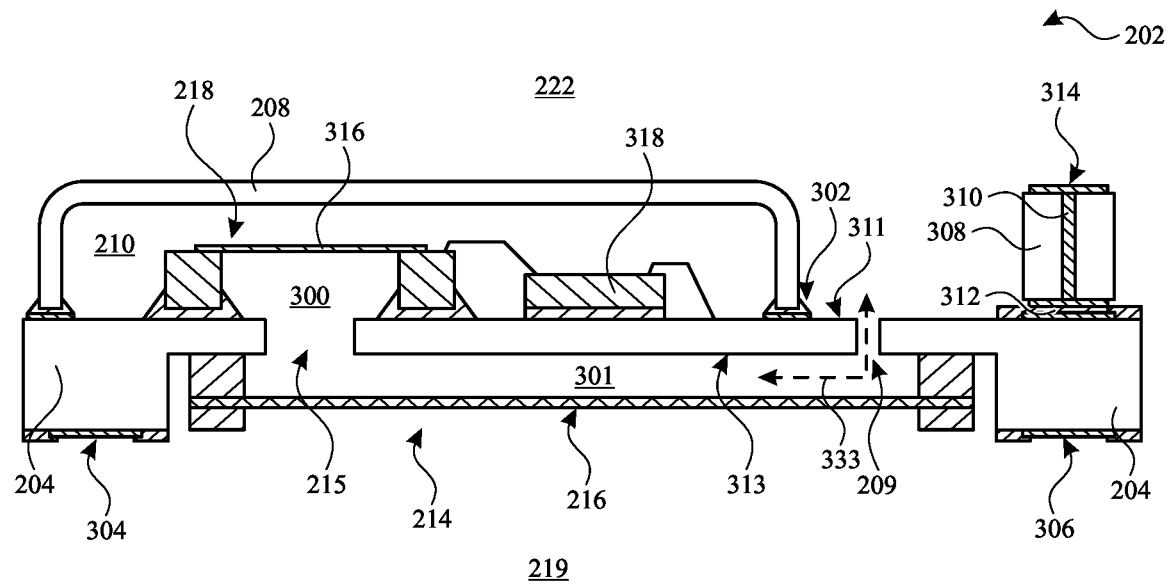
FIG. 3 illustrates a cross-sectional side view of a vented liquid-resistant microphone module in accordance with various aspects of the subject technology.

FIG. 3 shows a cross-sectional side view of the microphone module 202 in an exemplary implementation. In the example of FIG. 3, the microphone module 202 includes the substrate 204 having a side 311 (e.g., a first side) and a side 313 opposite the first side (e.g., an opposing second side). As shown, the cover 208 may be mounted to the side 311 of the substrate 204 and may at least partially define (e.g., along with a portion of the substrate 204 and a portion of the sensor circuitry) the back volume 210 of the microphone module 202. For example, the cover 208 may be attached to the surface of the substrate 204 on the side 311 using a conductive adhesive 302, such as a solder material. In one or more implementations, the solder material may also fluidly seal the back volume 210 from an environment outside the cover, such as the internal volume 222 of the electronic device 100. In the cross-sectional side view of FIG. 3, it can be seen that a front volume 300 is separated from the back volume 210 by a sound-responsive element 316. As shown, the front volume 300 is fluidly coupled to the opening 215 in the substrate 204.

In the example of FIG. 3, the non-porous membrane 216 is attached to the side 313 of the substrate within the recess 214 in the substrate, and substantially spans the recess 214. In various implementations, the non-porous membrane 216 may be formed from a polytetrafluoroethylene (PTFE) film, such as a non-expanded PTFE film, or a polyimide film. The non-porous membrane may have a thickness of, for example, between one micron and twenty microns, in various implementations.

As shown in FIG. 3, the non-porous membrane 216 defines a sealed volume 301 that is fluidly coupled to the front volume 300 via the opening 215. In this configuration, the non-porous membrane 216 provides a liquid-resistant seal between the front volume 300 and a first environment external to the microphone module 202 on the side 313 of the substrate 204 (e.g., the environment 219 external to the electronic device 100 in one or more implementations). As shown, the opening 209 in the substrate 204 may extend from the sealed volume 301 defined by the non-porous membrane 216, through the substrate 204, to a second environment external to the microphone module on the side 311 of the substrate 204 (e.g., a second environment formed by or including the internal volume 222 of the electronic device 100 in one or more implementations). In this way, the opening 209 allows airflow 333 (e.g., due to motion of a sound-responsive element 316), through the opening 209, between the sealed volume 301 and the environment external to the microphone module on the side 311 of the substrate 204.

In the example of FIG. 3, the microphone module 202 includes a sound-responsive element 316. The sound responsive element may be a moveable diaphragm or an actuatable MEMS structure, in various implementations. The sound-responsive element 316 may move and/or vibrate responsive to sound that passes through the non-porous membrane 216. Motion of the sound-responsive element 316 may induce an electrical response that is passed to microphone circuitry, such as an integrated circuit 318 (e.g., an application-specific integrated circuit) that is also disposed under the cover 208 and within the back volume 210, for processing microphone signals generated by the sound-responsive element 316. For example, the sound-responsive element 316 and the integrated circuit 318 may form all or part of the sensor assembly 218 of FIG. 2. Microphone signals generated by the sound-responsive element 316 and/or processed by the integrated circuit 318 may be passed (e.g., via conductive structures including metal layers in the substrate 204) to one or more conductive contacts (e.g., a conductive contact 304 and/or a conductive contact 306 on the side 313 of the substrate and/or one or more conductive contacts such as conductive contact 312 on the side 311 of the substrate) on the substrate 204 for output to other devices and/or components (e.g., via a connector such as a flexible printed circuit attached to one or more of the conductive contacts).

In one or more implementations, the microphone module 202 may also include a circuitry block 308. For example, the circuitry block 308 may be coupled to the conductive contact 312 on the side 311 of the substrate 204, and may include one or more conductive vias 310 that extend vertically away from the substrate 204 to one or more conductive contacts, such as conductive contact 314 on a top surface of the circuitry block 308. In various implementations, the microphone module, may be provided with any subset, or all of the conductive contacts of FIG. 3, and/or one or more other conductive contacts or mechanisms such as solder balls. For example, in one or more implementations in which the microphone module 202 includes the circuitry block 308 on the conductive contact 312, the microphone module 202 may omit the conductive contact 304 and the conductive contact 306. In other examples, the microphone module 202 may include the conductive contact 304 and the conductive contact 306 and omit the conductive contact 312 and/or the circuitry block 308. Any or all of the conductive contacts of FIG. 3 may be electrically coupled to device circuitry (e.g., a volatile and/or non-volatile memory, one or more processors, etc.) of the electronic device 100 via a connector, such as a flexible printed circuit attached to one or more of the conductive contacts.

Figure 4:
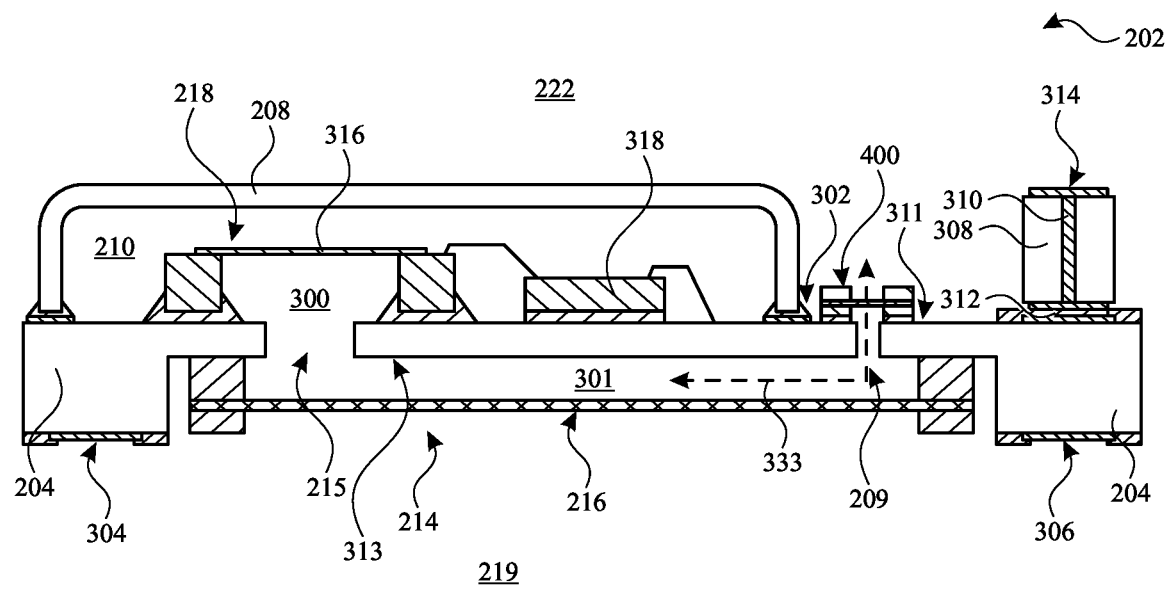
FIG. 4 illustrates a cross-sectional side view of a vented liquid-resistant microphone module having a resistive vent in accordance with various aspects of the subject technology.

FIG. 4 illustrates an example of the microphone module 202 in which a resistive vent 400 (also referred to herein as a resistive filter) is disposed over the opening 209 on the side 311 of the substrate 204. For example, the resistive vent 400 of FIG. 4 includes a porous membrane that spans over the opening 209 and that allows airflow therethrough while prevent passage of sound there through. In this example, the resistive vent 400 is attached to the substrate 204 on the side 311. As illustrated in FIG. 4, the resistive vent 400 spans over the opening 209 and the airflow 333 may flow (e.g., due to motion of the sound-responsive element 316), through the opening 209 and through the resistive vent 400, between the sealed volume 301 and the environment external to the microphone module on the side 311 of the substrate 204 (e.g., the internal volume 222 of the electronic device 100 in one or more implementations). In the example of FIG. 4, the resistive vent 400 is disposed on the side 311 of the substrate. However, as shown in FIG. 5, the resistive vent 400 may be disposed over the opening 209 on the side 313 of the substrate 204 (e.g., attached to the surface of the substrate 204 on the side 313) in one or more implementations.

Figure 5:
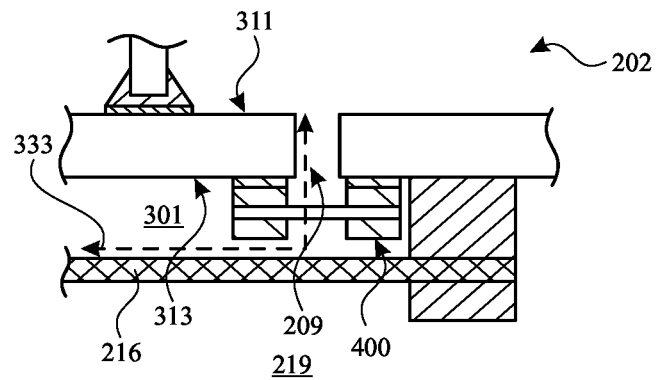
FIG. 5 illustrates a cross-sectional side view of a portion of another vented liquid-resistant microphone module having a resistive vent in accordance with various aspects of the subject technology.
Figure 6:
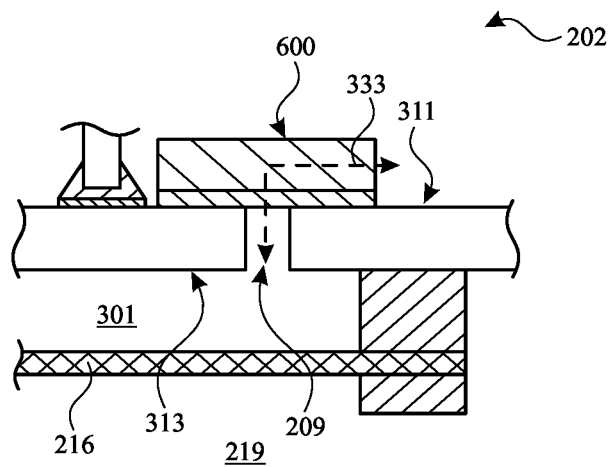
FIG. 6 illustrates a cross-sectional side view of a vented liquid-resistant microphone module having an inductive vent in accordance with various aspects of the subject technology.
Figure 7:
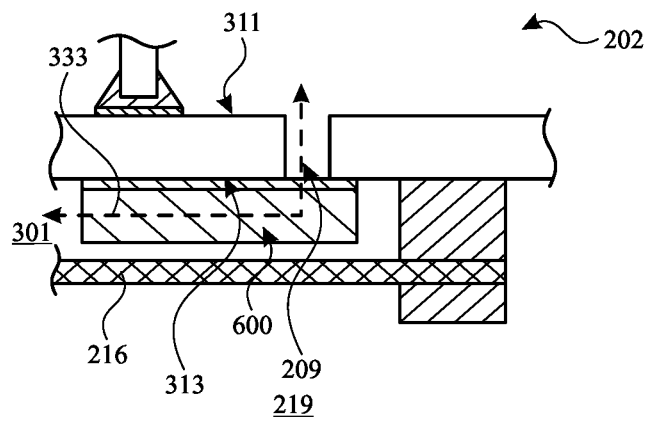
FIG. 7 illustrates a cross-sectional side view of a portion of another vented liquid-resistant microphone module having an inductive vent in accordance with various aspects of the subject technology.

In the examples of FIGS. 4 and 5, a resistive vent 400 is provided over the opening 209. In one or more implementations, the microphone module 202 may also, or alternatively, include an inductive vent (sometimes referred to as an inductive filter) over the opening 209. As examples, FIG. 6 illustrates an implementation in which the microphone module 202 includes an inductive vent 600 over the opening 209 on the side 311 of the substrate 204, and FIG. 7 illustrates an implementation in which the microphone module 202 includes an inductive vent 600 over the opening 209 on the side 313 of the substrate 204. In the examples of FIGS. 6 and 7, the inductive vent 600 is attached to a surface of the substrate 204 (e.g. on the sides 311 and 313 respectively) and covers the opening 209. As discussed in further detail hereinafter, the inductive vent 600 may include a channel within a substrate, the channel having a length that is substantially larger than the width of the channel, so that the inductive vent 600 acts as a low pass acoustic filter.

As illustrated in FIGS. 4 and 5, the airflow 333 may pass directly through a resistive vent 400 (e.g., through a porous membrane of the resistive vent). As illustrated in FIGS. 6 and 7, the airflow 333, in an implementation in which an inductive vent 600 is provided, may include a portion that travels laterally through the inductive vent 600 (e.g., through a serpentine fluid pathway or channel in the inductive vent, as described in further detail hereinafter) in a direction substantially parallel to a surface of the substrate 204, for at least a portion of the pathway.

In these examples, the non-porous membrane is mounted to the side 313 of the substrate 204 (e.g., mounted directly to the surface of the substrate 204 on the side 313 and laterally outward of the inductive vent 600 in FIG. 7). In one or more other implementations, the microphone module 202 may include an inductive vent 600 over the opening 209 on the side 313 of the substrate 204, and the non-porous membrane 216 may be mounted to the inductive vent 600.

Figure 8:
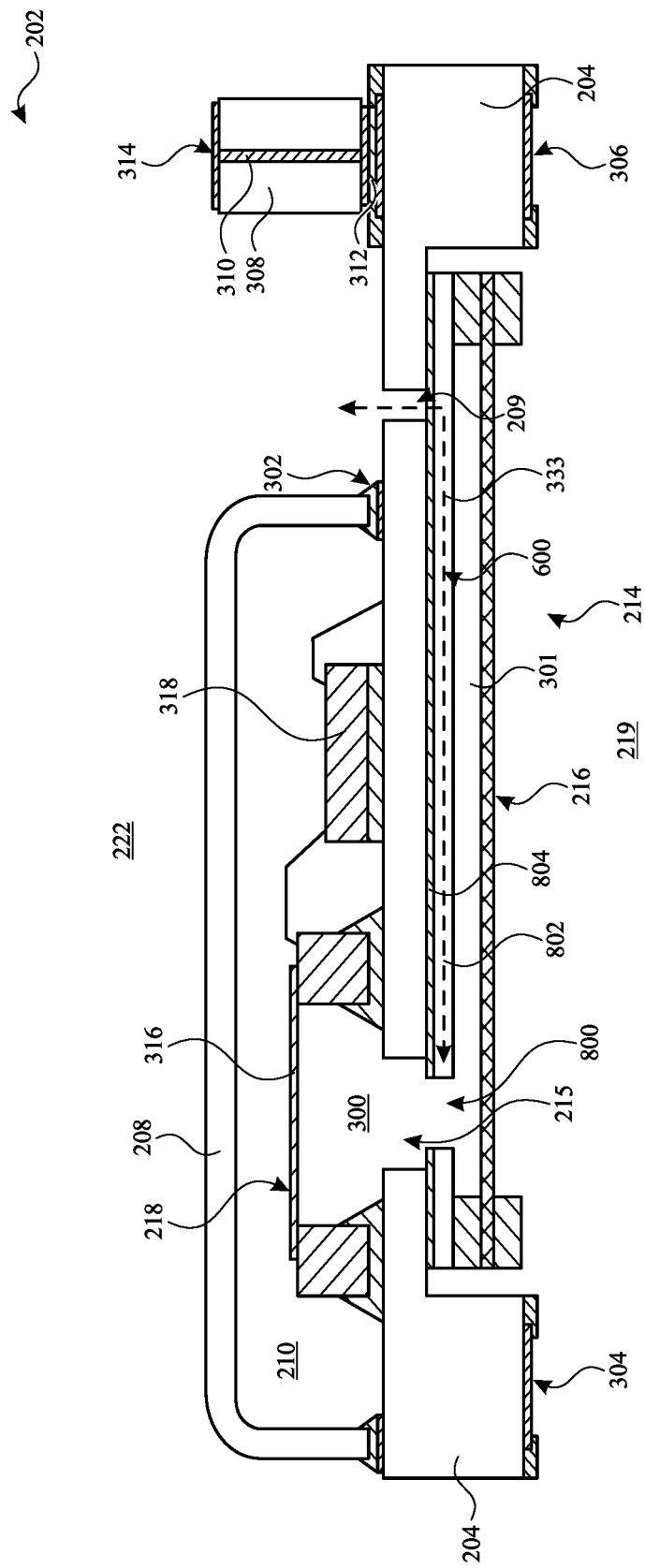
FIG. 8 illustrates a cross-sectional side view of another vented liquid-resistant microphone module having an inductive vent in accordance with various aspects of the subject technology.

For example, FIG. 8 illustrates an implementation in which the inductive vent 600 substantially spans the recess 214 in the substrate 204, and the non-porous membrane 216 is attached to the inductive vent 600 (e.g., attached to the substrate 204 via the inductive vent 600). The wider implementation of the inductive vent 600 of FIG. 8 may allow an relatively longer internal fluid pathway to extend between a first port coupled to the front volume 300 and a second port coupled to the opening 209. As shown, the inductive vent 600 may include an opening 800 that is aligned with the opening 215 in the substrate 204, to allow sound to pass through the opening 215 and the opening 800 to the sound-responsive element 316. In one or more implementations, the inductive vent 600 includes a fluid pathway, such as a serpentine fluid pathway. The fluid pathway in the inductive vent 600 may, in one or more implementations, include a first portion formed on a first side of the opening 215 and a second portion formed on a second side of the opening 215. In one or more implementations, the fluid pathway may extend around the opening 800. For example in a serpentine fluid pathway, two or more segments of the serpentine fluid pathway may be spaced apart by a distance that is wider than a width of the opening 800, or one or more segments of the serpentine fluid pathway may include a curve or a bend that passes around the opening 800 without fluidly coupling to the opening 800. In one or more implementations, a port or a segment of the serpentine fluid pathway may fluidly couple to the opening 800.

As shown in FIG. 8, in one or more implementations, the inductive vent 600 may be formed from a substrate 802 and a cover layer. For example, the substrate 802 may be a patterned substrate in which an etched channel partially defines a fluid pathway, such as a serpentine fluid pathway. For example, the etched channel may define two opposing sidewalls and a bottom wall that extends between the two opposing sidewalls, and the substrate 802 (e.g., prior to attachment to the substrate 204) may define an open channel without a top wall. As shown in FIG. 8, an adhesive layer 804 may attach the substrate 802 of the inductive vent 600 to the substrate 204 of the microphone module 202. In this way, the substrate 204 and/or the adhesive layer 804 can form a cover layer for the inductive vent 600. In one or more implementations, the adhesive layer 804 may cover the fluid pathway and (e.g., in combination with the substrate 204) define a wall, such as a top wall of the fluid pathway formed by the etched pattern in the substrate 802. The adhesive layer 804 may be formed, for example, from a heat activated film, a pressure-sensitive adhesive, a curable liquid adhesive, or another adhesive material. In one or more other implementations described herein, the cover layer that forms the top wall of an etched pattern in the substrate of an inductive vent can include or incorporate by a polymer layer such as a polyimide tape that is adhesively attached to the substrate of the inductive vent. As shown in FIG. 8, the adhesive layer 804 may adhesively attach the substrate 204 to the side 313 of the substrate 204, within the recess 214. In this example, the non-porous membrane 216 is attached to the substrate 204 of the inductive vent 600.

In the example of FIG. 8, the inductive vent 600 is disposed on the side 313 of the substrate 204, and the microphone module 202 is provided without a resistive vent.

However, in one or more other implementations, the microphone module 202 may include the inductive vent 600 disposed on the side 313 of the substrate 204 and a resistive vent over the opening 209.

Figure 9:
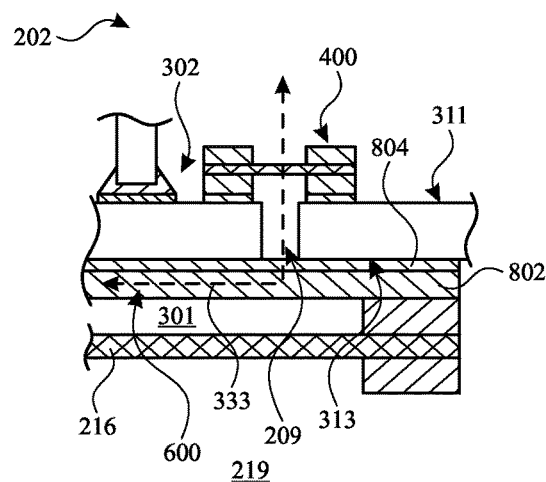
FIG. 9 illustrates a cross-sectional side view of a portion of a vented liquid-resistant microphone module having a resistive vent and an inductive vent in accordance with various aspects of the subject technology.

For example, FIG. 9 illustrates an example implementation of the microphone module 202 in which the microphone module 202 includes an inductive vent 600 disposed over the opening 209 on the side 313 of the substrate 204, and a resistive vent 400 over the opening 209 on the side 311 of the substrate 204. In this example, the airflow 333 passes directly through the resistive vent 400, through the opening 209, and laterally through the inductive vent 600 in a direction substantially parallel to a surface of the substrate 204. In this example, the non-porous membrane 216 is attached to the inductive vent 600.

Figure 10:
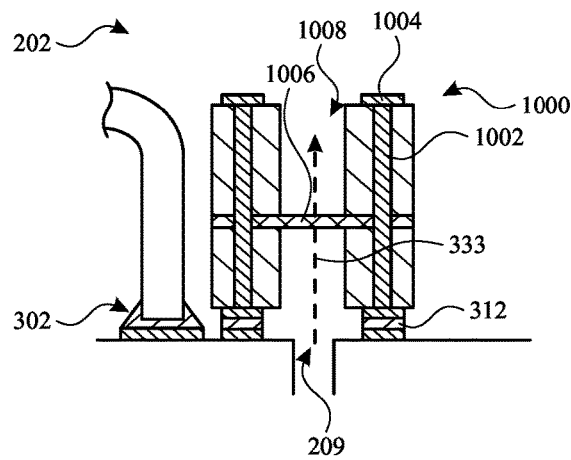
FIG. 10 illustrates a cross-sectional side view of a vented liquid-resistant microphone module having a resistive vent disposed in a circuit block in accordance with various aspects of the subject technology.

FIG. 10 illustrates another example implementation in which the microphone module 202 includes a resistive vent over the opening 209 on the side 311 of the substrate 204. In the example, of FIG. 10, a circuitry block 1000 (e.g., an input/output (I/O) block) is disposed over the opening 209 on the side 311 of the substrate 204. In this example, the circuitry block 1000 includes a conductive via 1002 extending from the conductive contact 312 to a conductive contact 1004 on a top surface of the circuitry block 1000. In this example, the circuitry block 1000 also forms a resistive vent over the opening 209. In this example, the resistive vent is disposed in the circuitry block. For example, the resistive vent may be formed by a membrane 1006 (e.g., a porous membrane) that spans across a central opening 1008 in the circuitry block 1000.

In the example of FIG. 10, the circuitry block 1000 is disposed on the side 311 of the substrate, and the microphone module 202 may be provided without an inductive vent 600, or may include an inductive vent 600 (e.g., an inductive vent as shown in FIG. 7 or an inductive vent that spans the cavity 214 as in FIG. 8) over the opening 209 on the side 313 of the substrate 204. For example, in one or more implementations, the microphone module 202 may include a circuitry block 1000 including a resistive vent mounted over the opening 209 on the side 313 of the substrate 204, and an inductive vent 600 over the opening 209 on the side 313 of the substrate 204. In the example of FIG. 10, the microphone module 202 may be provided with the circuitry block 1000 over the opening 209 and without the circuitry block 308 (see, e.g., FIG. 3), or may include both the circuitry block 1000 over the opening 209 and the circuitry block 308 on the side 311 of the substrate 204. For example, in an implementation in which the microphone module 202 includes both the circuitry block 1000 over the opening 209 and the circuitry block 308 on the side 311 of the substrate 204, the circuitry block 1000 may be used to route electrical signals from the microphone circuitry to the conductive contact(s) 1004 on the top of the circuitry block 1000 (e.g., for transmission to other device circuitry, such as a processor, via an interface, such as a flexible printed circuit), and the circuitry block 308 may provide an additional input/output (I/O) block for embedding functional silicon die (e.g., to provide RF filtering or other processing for the microphone signals from the microphone module 202.

Referring back to the example of FIG. 9, the microphone module 202 includes an inductive vent 600 disposed over the opening 209 on the side 313 of the substrate 204, a resistive vent 400 over the opening 209 on the side 311 of the substrate 204, and the non-porous membrane 216 is attached to the inductive vent 600 (e.g., to the substrate 802 of the inductive vent 600). In another example, FIG. 11 illustrates an implementation in which the microphone module 202 includes an inductive vent 600 disposed over the opening 209 on the side 313 of the substrate 204, a resistive vent 400 over the opening 209 on the side 311 of the substrate 204, and the non-porous membrane 216 is attached directly to the substrate 204 (e.g., laterally outward of the location at which the inductive vent 600 is attached to the substrate 204).

Figure 11:
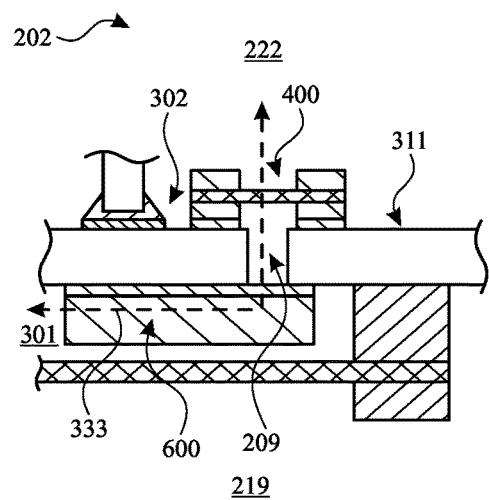
FIG. 11 illustrates a cross-sectional side view of a portion of another vented liquid-resistant microphone module having a resistive vent and an inductive vent in accordance with various aspects of the subject technology.

In the example of FIG. 11, the resistive vent 400 is disposed on the side 311 of the substrate 204 (e.g., within the environment on that side of the substrate 204, such as within the internal volume 222 of the electronic device 100) and the inductive vent 600 is disposed on the side 313 of the substrate 204 (e.g., within the sealed volume 301). In the examples of FIGS. 9 and 11, the microphone module 202 includes a resistive vent 400 over the opening 209 on the side 311 of the substrate 204, and an inductive vent 600 over the opening 209 on the side 313 of the substrate 204. In the examples of FIGS. 9 and 11, a venting path (e.g., a barometric equalization path) through the inductive vent 600 and the resistive vent 400 is illustrated by the airflow 333 that flows between the front volume 300, through a channel in the inductive vent 600 and through a porous membrane in the resistive vent 400, and the environment external to the microphone module on the side 311 of the substrate (e.g., an air reservoir formed by the internal volume 222 within the housing 106 of electronic device 100).

Figure 12:
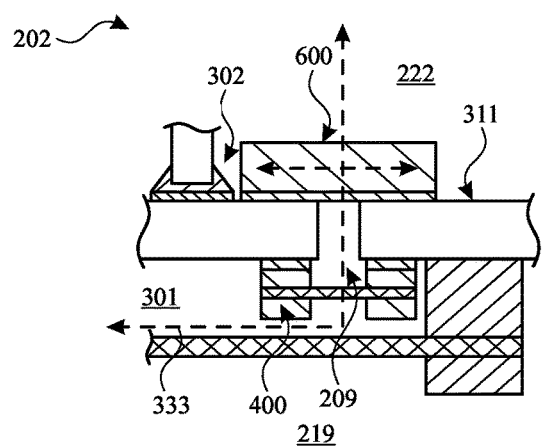
FIG. 12 illustrates a cross-sectional side view of a portion of another vented liquid-resistant microphone module having a resistive vent and an inductive vent in accordance with various aspects of the subject technology.

FIG. 12 illustrates another implementation of the microphone module 202, in which the resistive vent 400 is disposed over the opening 209 on the side 313 of the substrate 204 (e.g., within the sealed volume 301) and the inductive vent 600 is disposed over the opening 209 on the side 311 of the substrate 204 (e.g., within the environment external to the microphone module on the side 311 of the substrate such as within the internal volume 222 within the housing 106 of electronic device 100). In the example of FIG. 12, the microphone module 202 includes an inductive vent 600 over the opening 209 on the side 311 of the substrate 204 and a resistive vent 400 over the opening 209 on the side 313 of the substrate 204.

Figure 13:
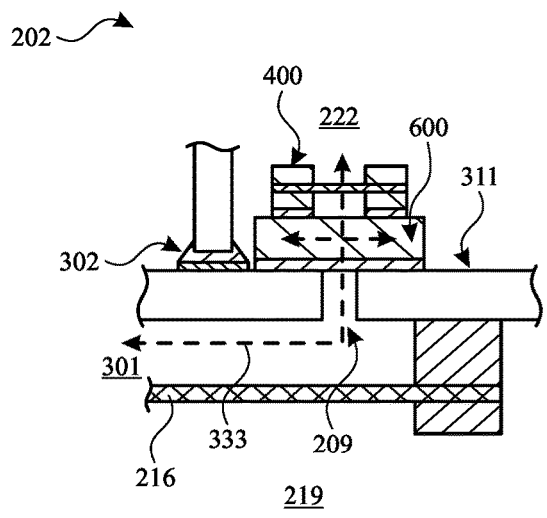
FIG. 13 illustrates a cross-sectional side view of a portion of another vented liquid-resistant microphone module having a resistive vent and an inductive vent in accordance with various aspects of the subject technology.

In various examples described herein, a resistive vent 400 is disposed on one side of the substrate 204, and an inductive vent 600 is disposed on an opposing side of the substrate 204. In one or more other implementations, an inductive vent and a resistive vent may be formed on the same side of the substrate 204. For example, FIG. 13 illustrates an implementation in which the inductive vent 600 is attached to the substrate 204 on the side 311 of the substrate 204, and a resistive vent 400 is attached to the inductive vent 600 (e.g., on a side of the inductive vent that is opposite to the side of the inductive vent 600 that is attached to the substrate 204). As illustrated, in this arrangement, the airflow 333 may flow between the sealed volume 301 on the side 313 of the substrate 204 and the environment (e.g., internal volume 222 of the electronic device 100) on the side 311 of the substrate via the opening 209, via a first port on the bottom of the inductive vent 600 adjacent the opening 209, a fluid channel within the inductive vent 600 (e.g., including a portion that extends in a direction parallel to the surface of the substrate 204), a port on the top surface of the inductive vent 600, and the resistive vent 400. In this arrangement, the inductive vent 600 may be adhesively attached to the substrate 204 and the resistive vent 400 may be (e.g., adhesively) attached to the inductive vent 600. In this arrangement, the inductive vent 600 may have a first port on a first side and fluidly coupled to the opening 209, and a second port on an opposing second side and fluidly coupled to the resistive vent 400. In the example of FIG. 13, the microphone module 202 includes an inductive vent 600 mounted over the opening 209 on the side 313 of the substrate 204, and a resistive vent 400 mounted on the inductive vent 600.

Figure 14:
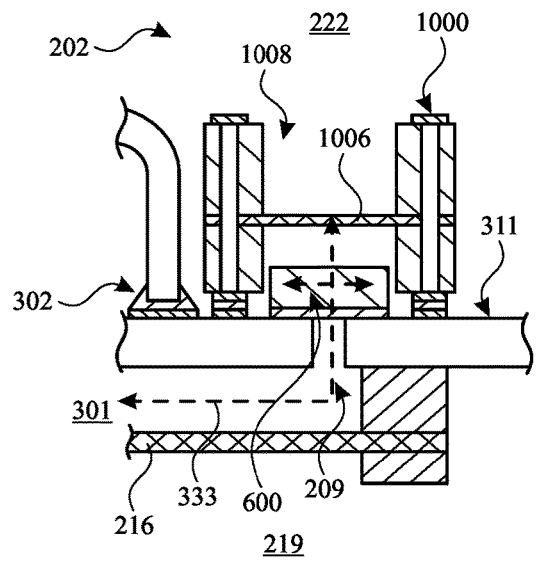
FIG. 14 illustrates a cross-sectional side view of a portion of a vented liquid-resistant microphone module having an inductive vent and a resistive vent disposed in a circuit block in accordance with various aspects of the subject technology.

FIG. 14 illustrates another implementation in which an inductive vent and a resistive vent are formed on the same side of the substrate 204. In the example of FIG. 14, the microphone module 202 includes the circuitry block 1000 having the central opening 1008 and the membrane 1006 on the side 311 of the substrate, and also includes an inductive vent 600 disposed over the opening 209 on the side 311 of the substrate. In this example, the inductive vent 600 is disposed within the central opening 1008 in the circuitry block 1000. In the example of FIG. 14, the microphone module 202 includes a circuitry block 1000 mounted over the opening 209 on the side 311 of the substrate 204, a resistive vent spanning opening (e.g., the central opening 1008) in the circuitry block, and an inductive vent 600 mounted over the opening 209 on the side 311 of the substrate 204 and within the opening in the circuitry block 1000.

In various examples described herein in connection with FIGS. 2-14, the microphone module 202 includes an opening 215 (e.g., a first opening) that may be an acoustic port for the microphone module), and an opening 209 (e.g., a second opening) that provides a leak port from the front volume 300 to an environment on the side 311 of the substrate 204 (e.g., an internal volume 222 of the electronic device 100 outside of and fluidly separated from the back volume 210 of the microphone module). In one or more implementations, the microphone module may include another leak port between the front volume 300 and the back volume 210. The other leak port may be formed by another opening (e.g., a third opening) in the substrate 204, such as substantially between the opening 215 and the opening 209.

Figure 15:
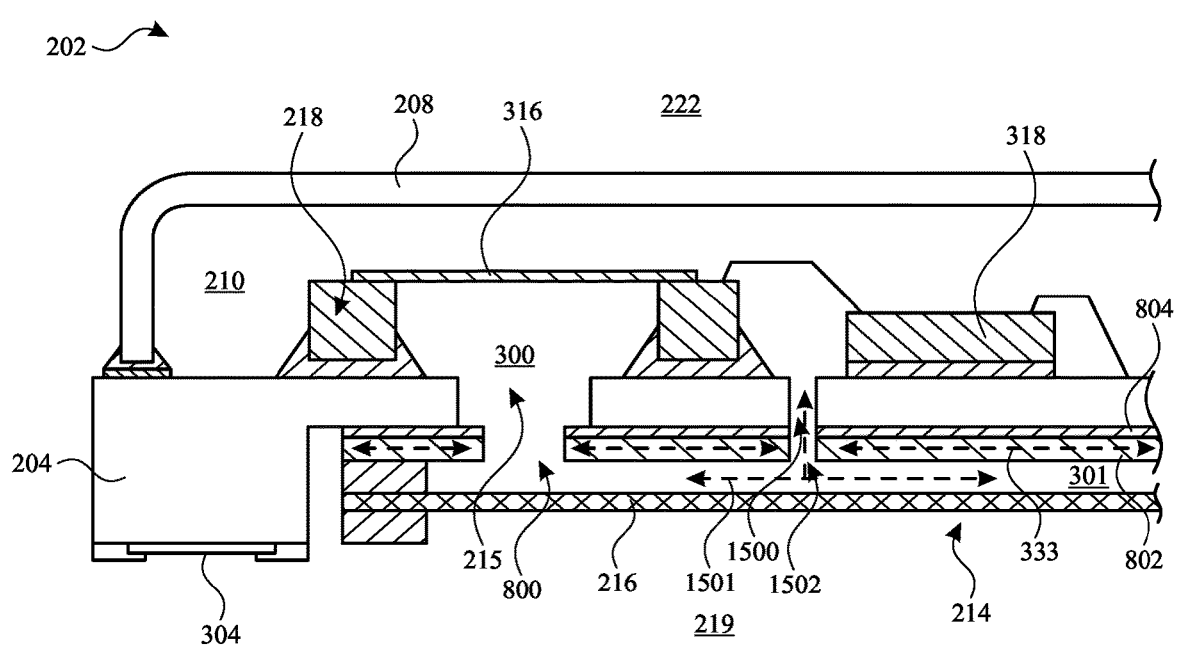
FIG. 15 illustrates a cross-sectional side view of a portion of a vented liquid-resistant microphone module having an inductive vent and an additional vent to a back volume in accordance with various aspects of the subject technology.

For example, FIG. 15 illustrates an implementation in which the microphone module 202 includes an inductive vent 600 mounted over the opening 209 on the side 313 of the substrate 204, and an opening 1500 (e.g., a third opening) in the substrate 204. In the example of FIG. 15, the inductive vent 600 also includes an opening 1502. As shown, the opening 1502 in the inductive vent 600 may be aligned with the opening 1500 in the substrate 204 to fluidly couple the front volume 300 and the back volume 210. In one or more implementations, the opening 1502 extends through the inductive vent 600 and the inductive filter also includes a fluid pathway (e.g., a serpentine fluid pathway) therewithin that extends around the opening 1502 without fluidly coupling with the opening 1502. In this way, the substrate 204 can include an opening 209 that is covered by an inductive vent 600 and an opening 1502 that is uncovered. As illustrated in FIG. 15, the microphone module 202 may include an airflow pathway 1501 that includes a portion that flows directly between the sealed volume 301 and the back volume 210 (e.g., to provide the other leak port between the front volume 300 and the back volume 210, such as to enable a linear frequency response for the microphone module), and a portion that flows within the inductive vent 600 (e.g., within a serpentine fluid pathway that extends around the opening 215 and the opening 1502) and between the sealed volume 301 and the environment on the side 311 of the substrate via the opening 209.

In the implementation illustrated in of FIG. 15, the microphone module 202 having the opening 1500 in the substrate 204 and the opening 1502 in the inductive vent 600 may be provided without a resistive vent over the opening 209, or may include a resistive vent 400, a circuitry block 1000 including a resistive vent, and/or a circuitry block 308, as described herein in connection with any of the implementations of FIGS. 3, 4, 5, 8, 9, 10, and/or 11. For example, in one or more implementations, the microphone module 202 having the opening 1500 in the substrate 204 and the opening 1502 in the inductive vent 600 may include a resistive vent 400 over the opening 209 on the side 311 of the substrate 204. As another example, in one or more implementations, the microphone module 202 having the opening 1500 in the substrate 204 and the opening 1502 in the inductive vent 600 may include a resistive vent that is disposed within a circuitry block 1000 attached to the side 311 of the substrate 204.

In the examples of FIGS. 6-14, the microphone module 202 may include an inductive vent that is attached to the substrate 204, such as by an adhesive material (e.g., an adhesive material that attaches a cover layer of the inductive vent to the substrate 204. In one or more other implementations, the microphone module 202 may include an inductive filter that is formed, at least in part, within the substrate 204 (also referred to herein as a microphone substrate) of the microphone. For example, FIG. 16 illustrates an implementation in which an inductive filter 1600 (also referred to herein as an inductive vent) is disposed in the substrate 204 and extends from the opening 215 to the opening 209.

Figure 16:
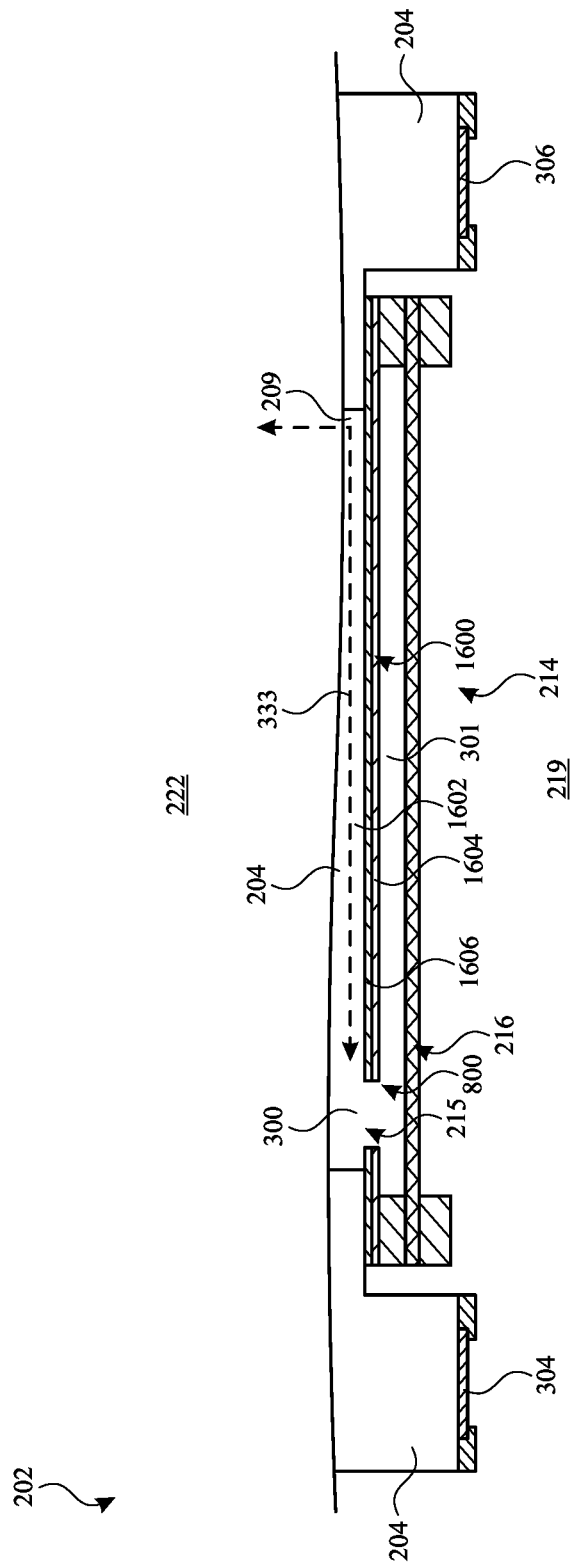
FIG. 16 illustrates a cross-sectional side view of a portion of a vented liquid-resistant microphone module having an inductive vent that is at least partially disposed in a microphone substrate in accordance with various aspects of the subject technology.

As shown in FIG. 16, the inductive filter 1600 may include a channel 1602 formed in the substrate 204. For example, the channel 1602 may be an etched channel (e.g., a laser etched channel, a chemically etched channel, or the like) that follows a path, such as a serpentine path, within the substrate 204. In one or more implementations, the channel 1602 may be an open channel having three sides formed by a groove in the substrate 204, and may be closed by a cover layer attached to the substrate 204. For example, the cover layer may include a cover 1604 (e.g., an outer layer, or outer cover layer, such as polyimide or other polymer layer) that is attached to the substrate 204 by an adhesive layer 1606. For example, the adhesive layer 1606 may be a heat activated film, a pressure sensitive adhesive, a curable liquid adhesive, or other adhesive material. The channel 1602 may be, for example, a serpentine channel having one or more switchback segments, and may have a channel width and an channel length that is substantially larger (e.g., many times larger) than the channel width, as discussed in further detail hereinafter.

In the implementation of FIG. 16, the microphone module 202 having the inductive filter 1600 disposed in the substrate 204 may be provided without a resistive vent over the opening 209, or may include a resistive vent 400, a circuitry block 1000 including a resistive vent, and/or a circuitry block 308, as in any of the implementations of FIGS. 3, 4, 5, 8, 9, 10, and/or 11. For example, the microphone module 202 having the inductive filter 1600 disposed in the substrate 204 may include a resistive vent 400 over the opening 209 on the side 311 of the substrate 204. In one or more implementations, the resistive vent may be a resistive vent that is disposed in a circuitry block 1000 mounted to the side 311 of the substrate 204.

In the example of FIG. 16, the non-porous membrane 216 is mounted to the cover 1604 for the inductive filter 1600. In other examples, the non-porous membrane 216 may be mounted directly to the side 313 of the substrate 204. For example, the inductive filter 1600 may substantially span the width of the recess 214 as in the example of FIG. 16, or the inductive filter 1600 may have shorter lateral extent within the substrate 204, and the non-porous membrane 216 may be attached directly to the substrate 204 laterally outward of the distal ends of the cover 1604 of the inductive filter 1600.

In the example of FIG. 16, the substrate 204 is provided without an additional opening between the front volume 300 and the back volume 210. However, in other implementations, the microphone module 202 having the inductive filter 1600 disposed in the substrate 204 and/or having a resistive vent and/or a circuitry block disposed thereon may include an additional opening, such as the opening 1500 of FIG. 15 that extends between the sealed volume 301 and the back volume 210. In these implementations, the opening 1500 may pass through the inductive filter 1600 without fluidly coupling to the channel 1602. For example, one or more segments of the channel 1602 may be spaced apart, curved, and/or bent to pass around the opening 1500 without fluidly coupling to the channel 1602.

Figure 17:
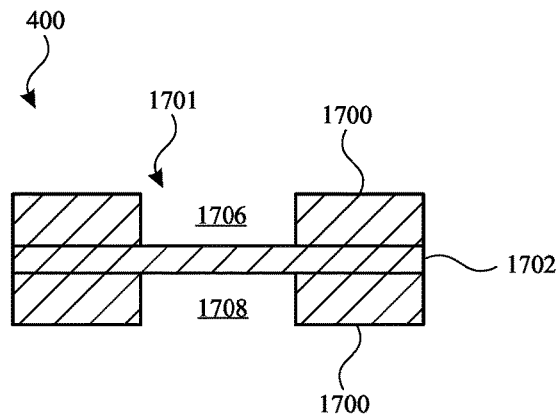
FIG. 17 illustrates a cross-sectional side view of a resistive vent in accordance with various aspects of the subject technology.

FIG. 17 illustrates a cross-sectional side view of a resistive vent 400 in accordance with one or more implementations. As shown in FIG. 17, the resistive vent 400 may include a frame 1700 having a central opening 1701. In one or more implementations, the central opening 1701 may be aligned with the opening 209 in the substrate 204 of the microphone module 202. As shown, the resistive vent 400 may also include a membrane 1702, such as a porous membrane (e.g., an expanded PTFE membrane) spanning the central opening 1701 in the frame 1700. For example, the membrane 1702 may be a porous membrane which allows airflow therethrough but has a large acoustic impedance. When implemented in the microphone module 202, the porous membrane 1702 may extend over the opening 209 in the substrate 204 as described herein in connection with various examples. Depending on the direction of airflow (e.g., airflow 333) through the membrane 1702 when installed over the opening 209, a portion of the central opening 1701 on a first side of the membrane 1702 may form a first ingress or egress aperture 1706, and a portion of the central opening 1701 on a second side of the membrane 1702 may form a second ingress or egress aperture 1708. In one or more implementations, the frame 1700 may be formed from plastic, or another substrate, such as a printed circuit substrate material (e.g., a glass-reinforced epoxy such as FR4).

Figure 18:
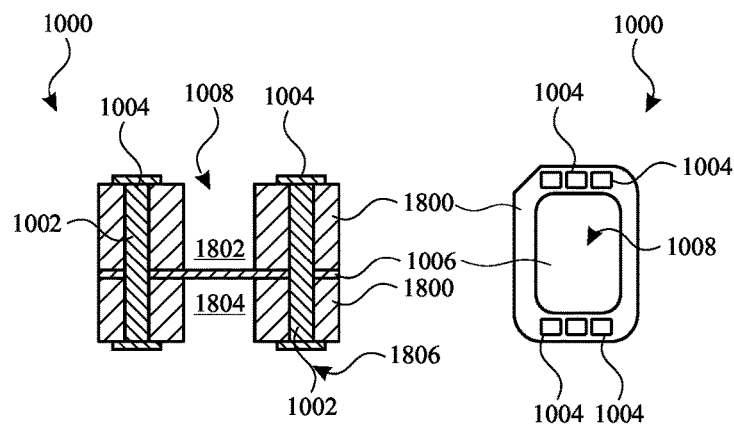
FIG. 18 illustrates aspects of a circuit block that includes a resistive vent in accordance with various aspects of the subject technology.

FIG. 18 illustrates a cross-sectional side view of the circuitry block 1000, in accordance with one or more implementations. A top view of the circuitry block 1000 is also shown in FIG. 18. As shown in FIG. 18, the circuitry block 1000 may include a frame 1800. In one or more implementations, the frame 1800 may be formed from plastic, or another substrate, such as a printed circuit substrate (e.g., a glass-reinforced epoxy such as FR4). As shown, the membrane 1006 may span a central opening 1008 in the frame 1800. As shown, conductive vias 1002 may be formed in the frame 1800. The conductive vias 1002 may each extend from a conductive contact (e.g., a solder pad) 1806 on a first side of the frame 1800 to a conductive contact 1004 (e.g., a solder pad) on an opposing second side of the frame 1800. In the cross-sectional view of FIG. 18, two conductive vias 1002 can be seen. However, in the top view, six conductive contacts 1004 are shown indicating six respective conductive vias within the frame. However, this is merely illustrative, and the circuitry block 1000 can be provided with any suitable number of conductive vias and corresponding contact pads. Depending on the direction of airflow (e.g., airflow 333) through the membrane 1006 when installed over the opening 209, a portion of the central opening 1008 on a first side of the membrane 1006 may form a first ingress or egress aperture 1802, and a portion of the central opening 1008 on a second side of the membrane 1006 may form a second ingress or egress aperture 1804.

As illustrated in the example of FIG. 18, in one or more implementations, when implemented in the microphone module 202, the circuitry block 1000 may include at least one conductive via 1002 extending from a first contact pad (e.g., a conductive contact 312) on the first side (e.g., side 311) of the substrate 204, away from the substrate 204 to a second contact pad (e.g., a conductive contact 1004) on a top surface of the circuitry block 1000. In this example, the circuitry block 1000 includes a main body that forms the frame 1800 of a resistive filter and encompasses the at least one conductive via 1002.

Figure 19:
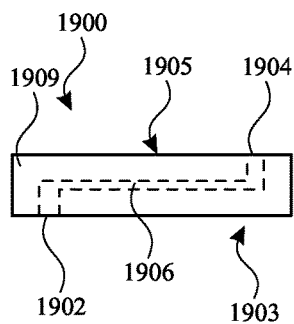
FIG. 19 illustrates a simplified cross-sectional side view of an inductive vent having a first port on a first side and a second port on an opposing second side in accordance with various aspects of the subject technology.
Figure 20:
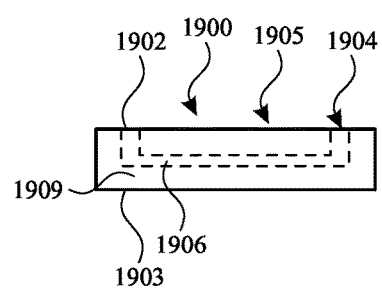
FIG. 20 illustrates a simplified cross-sectional side view of an inductive vent having a first port and a second port on a first side in accordance with various aspects of the subject technology.
Figure 21:
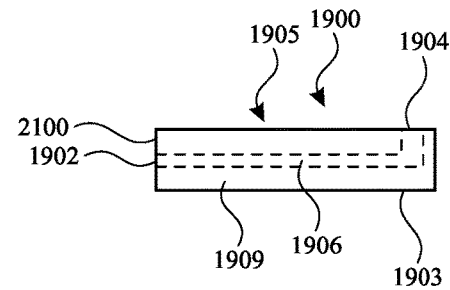
FIG. 21 illustrates a simplified cross-sectional side view of an inductive vent having a first port on an edge and a second port on a side in accordance with various aspects of the subject technology.

FIGS. 19-21 illustrate various simplified cross-sectional side views of an inductive filter 1900. As examples, the inductive filters 1900 of FIG. 19, 20, or 21 may be implementations of the inductive vent 600 or the inductive filter 1600 described herein. As indicated in FIG. 19, an inductive filter 1900 may include a first port 1902 formed on a side 1903 (e.g., a first side) of the inductive filter 1900, and a second port 1904 formed on a side 1905 (e.g., an opposing second side) of the inductive filter 1900. As shown, a channel 1906 (e.g., an implementation of the channel 1602 of FIG. 16 or an implementation of a channel within a separate substrate as in the examples of FIGS. 6, 7, 8, 9, 10, 11, 12, 13, 14, and/or 15) extends through a substrate 1909 (e.g., the substrate 204 or a separate inductive filter substrate) between the first port 1902 and the second port 1904. For example, the first port 1902 may couple to the front volume 300 of the microphone module, and the second port 1904 may couple to the opening 209 in the substrate 204.

In the example of FIG. 20, the first port 1902 and the second port 1904 of the inductive filter 1900 are both formed on a common side (e.g., side 1905 in this example) of the inductive filter 1900. In the example of FIG. 21, the first port 1902 of the inductive filter 1900 is formed on an edge 2100 of the inductive filter 1900, and the second port 1904 of the inductive filter is formed on a side 1905 of the inductive filter 1900. The inductive filters of FIGS. 19, 20, and 21 may be implemented as the inductive vent/filter of any of the examples of FIGS. 6, 7, 8, 9, 10, 11, 12, 13, 14, and/or 15. Although the channel 1906 is shown as a single linear channel segment in the examples of FIGS. 19-20, it is understood that the channel 1906 may be a serpentine channel or a channel having any other arrangement that extends the channel length relative to the width of the channel.

Figure 22:
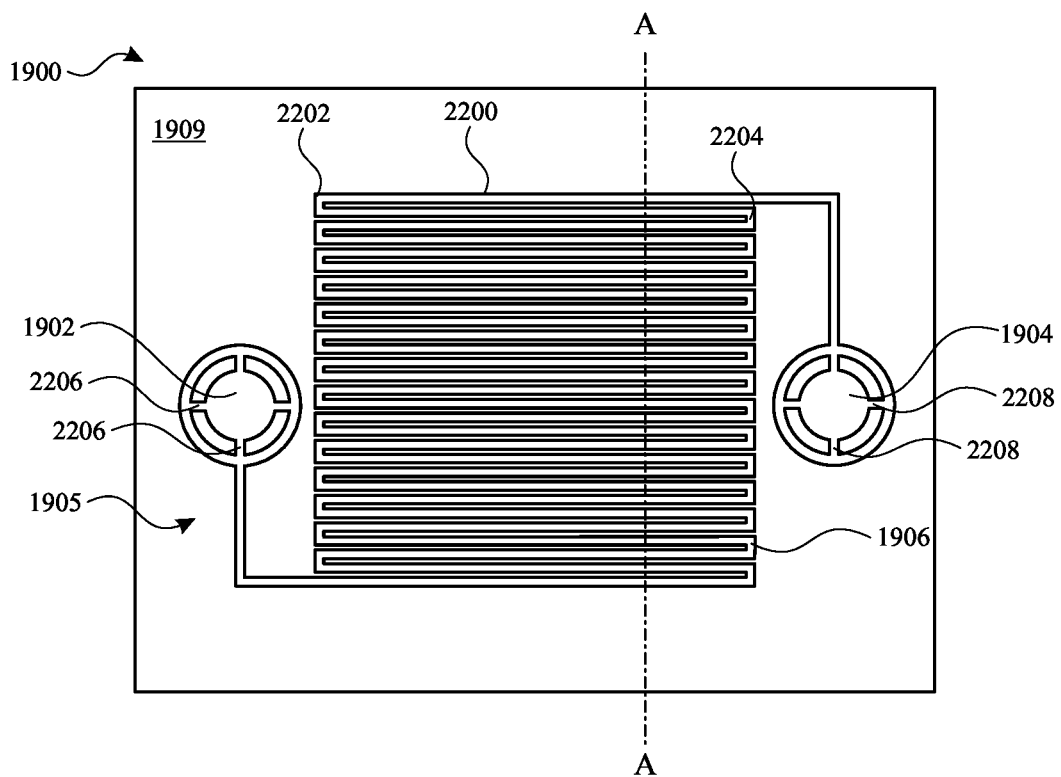
FIG. 22 illustrates a cross-sectional top view of an inductive vent having first and second ports on one or more sides and a serpentine fluid pathway therebetween in accordance with various aspects of the subject technology.
Figure 23:
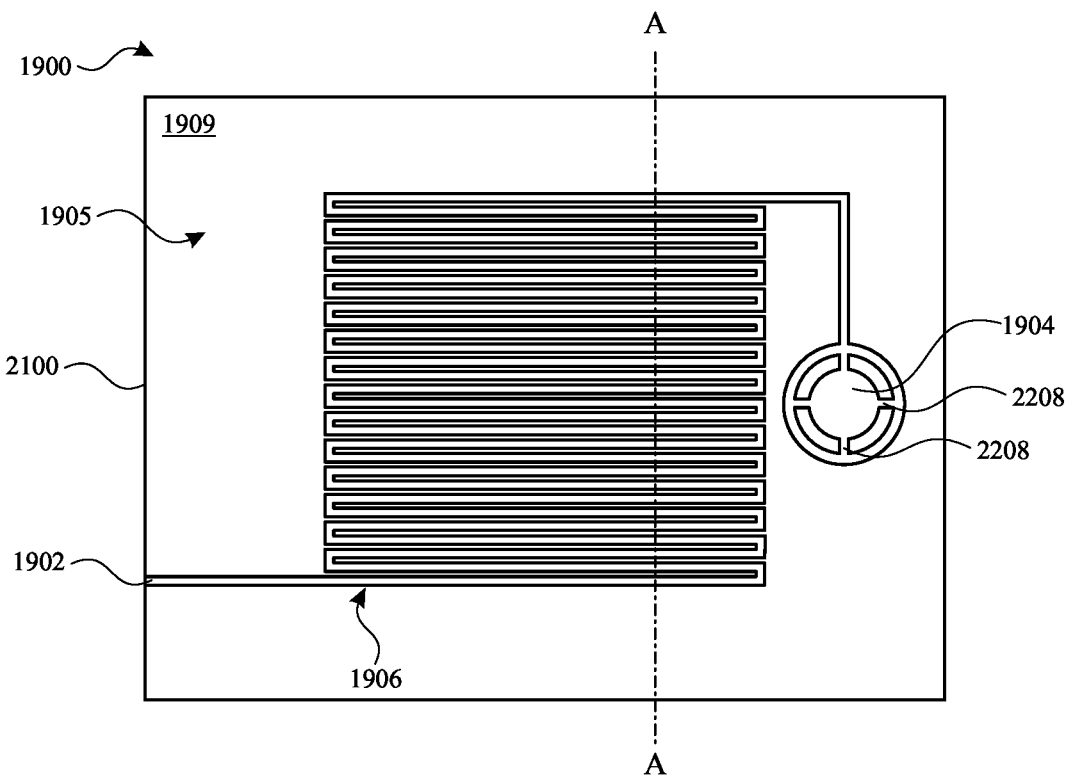
FIG. 23 illustrates a cross-sectional top side view of an inductive vent having a first port on an edge, a second port on a side, and a serpentine fluid pathway therebetween in accordance with various aspects of the subject technology.

For example, FIG. 22 illustrates a cross-sectional top view of the inductive filter 1900 in the arrangement of FIG. 20, in which the first port 1902 and the second port 1904 of the inductive filter 1900 are both formed on a side (e.g., both commonly formed on a side such as side 1905 or formed on opposing sides, such as sides 1903 and 1905) of the inductive filter 1900. FIG. 23 illustrates a cross-sectional top view of an example in which the first port 1902 of the inductive filter 1900 is formed on an edge 2100 of the inductive filter 1900, and the second port 1904 of the inductive filter is formed on a side 1905 of the inductive filter 1900.

As shown in FIGS. 22 and 23, the channel 1906 may be a serpentine channel that includes multiple parallel segments 2200 that extend between a bend 2202 and/or a bend 2204 to form switchback segments within the substrate 1909. In the example of FIGS. 22 and 23, the first port 1902 may be an ingress port configured to fluidly couple to the opening 215 in the substrate 204 of the microphone module 202. In the examples of FIGS. 22 and 23, the second port 1904 may be an egress port configured to fluidly couple to the opening 209 in the substrate 204 of the microphone module 202. As shown in the example of FIG. 22, the first port 1902 may include multiple input channels 2206 that are each fluidly coupled between the channel 1906 and the first port 1902. As shown in the examples of FIGS. 22 and 23, the second port 1904 may include multiple output channels 2208 that are each fluidly coupled between the channel 1906 and the second port 1904.

Figure 24:
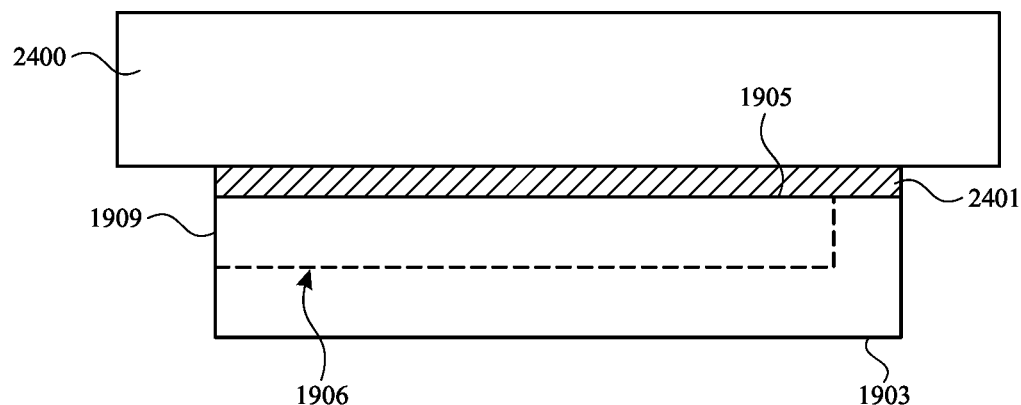
FIG. 24 illustrates a side view of an inductive vent having a first port on an edge and a second port on a side, and a serpentine fluid pathway therebetween in accordance with various aspects of the subject technology.

FIG. 24 illustrates a side view of the inductive filter 1900 of FIGS. 21 and 23, with the channel 1906 represented simply as a dashed line. The side view of FIG. 24 shows how the inductive filter 1900 may be formed from the substrate 1909 in which the channel 1906 is formed, and a cover 2400. As examples, the cover 2400 may be an implementation of the cover layer described above in connection with FIG. 8 or the cover 1604 of FIG. 16. As shown, the cover 2400 may be attached to the side 1905 of the substrate 1909 by an adhesive material 2401. As examples, the adhesive material 2401 may be an implementation of the adhesive layer 1606 of FIG. 16.

Figure 25:
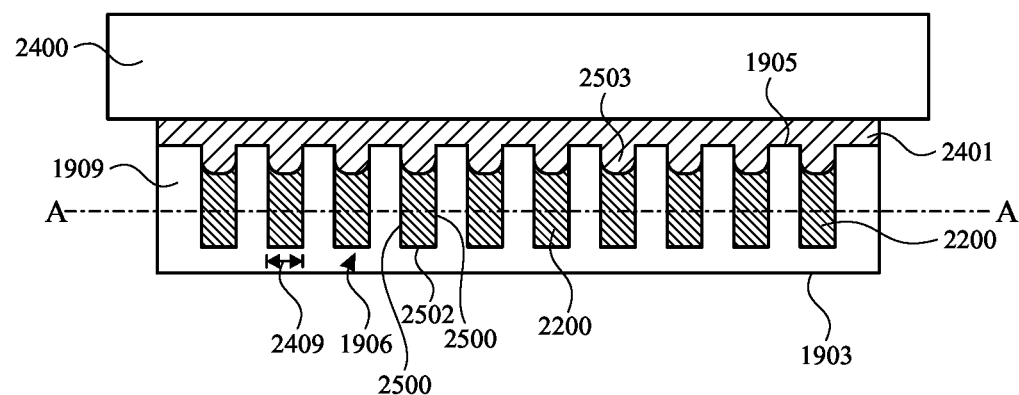
FIG. 25 illustrates a cross-sectional side view of an inductive vent in accordance with various aspects of the subject technology.

FIG. 25 illustrates a cross-sectional side view of the inductive filter 1900 in any of the implementations of FIGS. 19-24, in which the cross sections of several segments 2200 of the channel 1906 can be seen. For example, the cross-sectional view of FIG. 25 may be taken along the cross section A-A of either of FIG. 22 or 23. Although not visible in the cross-section of FIG. 25, the substrate 1909 includes at least one ingress aperture (e.g., first port 1902) and at least one egress aperture (e.g., second port 1904), on the same face, different faces, and/or edges of the substrate 1909 (e.g., as indicated in FIGS. 19-21). The adhesive material 2401 may be patterned such that ingress and egress ports from the channel 1906 are not blocked by the adhesive material. In one or more implementations, the channel 1906 may have a cross-sectional width 2409 (e.g., between two opposing sidewalls 2500) of between 10 microns and 100 microns, and may have a depth (e.g., between a side 1905 of the substrate 1909 and a floor 2502 of the channel 1906) of between 10 and 100 microns. In one or more implementations, the total length of the channel 1906 may be between 10 mm and 50 mm. In the example of FIG. 25, the inductive filter 1900 includes a patterned substrate (e.g., substrate 1909) and a cover layer attached to the patterned substrate, the cover layer defining a surface of a serpentine fluid pathway defined by the channel 1906. In one or more implementations, the cover layer includes an outer layer (e.g., cover 2400) and an adhesive material 2401, and the adhesive material 2401 extends into and partially defines a portion of the serpentine fluid pathway. In the example of FIG. 25, a portion of the adhesive material 2401 is in contact with the surface of the substrate 1909 on the side 1905, and a portion 2503 of the adhesive material 2401 extends partially into the segments 2200 of the channel 1906.

Figure 26:
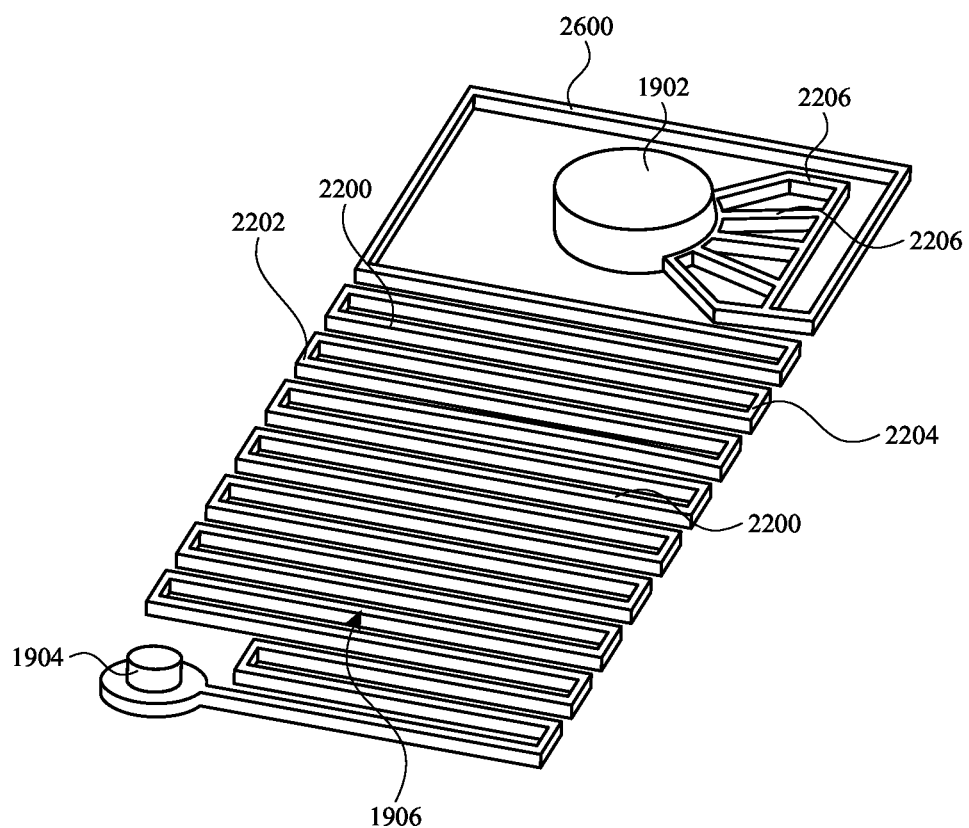
FIG. 26 illustrates a top perspective view of a fluid pathway of an inductive vent in accordance with various aspects of the subject technology.

FIG. 26 illustrates a perspective view of a fluid pathway, including the channel 1906, of the inductive filter 1900, with the substrate 1909, the cover 2400, and the adhesive material 2401 removed for clarity, in accordance with one or more implementations. As shown in FIG. 26, the channel 1906 may form a serpentine fluid pathway having multiple switchbacks formed by segments 2200, each extending between a bend 2202 and a bend 2204. As shown, multiple input channels 2206 may extend in parallel between the first port 1902 and the channel 1906. As shown, a portion 2600 of the channel 1906 may extend around the first port 1902 (e.g., an consequently around the opening 800 of FIG. 8) without fluidly coupling to the first port 1902. In one or more implementations, the first port 1902 may correspond to the opening 800 of FIG. 8. In the example of FIG. 26, the segments 2200 of the serpentine portion of the channel 1906 are evenly spaced and linear. However, in one or more implementations in which the inductive filter 1900 is provided with another opening, such as the opening 1502 of FIG. 15, one or more of the segments 2200 may have a different spacing and/or may include a curve or a bend around that other opening 1502, without fluidly coupling to that opening 1502. In the example of FIG. 26, the first port 1902 may fluidly couple to the opening 215 of the substrate 204 of a microphone module 202, and the second port 1904 may fluidly couple to the opening 209 in the substrate 204. It is appreciated that the number of segments 2200 illustrated in FIG. 26 is illustrative, and more or fewer segments 2200 may be used.

Figure 27:
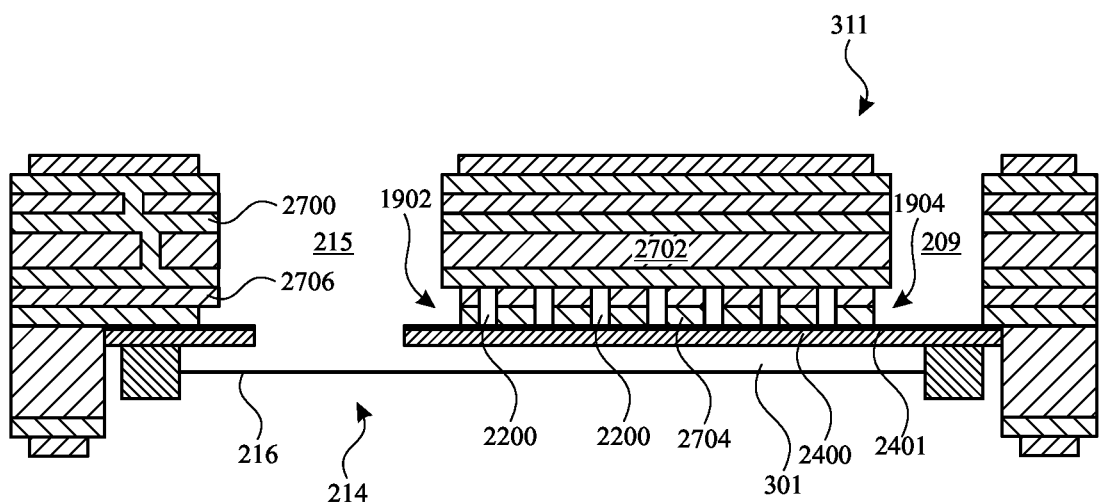
FIG. 27 illustrates a cross-sectional side view of a microphone substrate including an embedded inductive vent in accordance with various aspects of the subject technology.

As discussed herein in connection with various examples, such as the example of FIG. 16, in one or more implementations, an inductive filter (e.g., inductive vent 600, inductive filter 1600, and/or inductive filter 1900) may be at least partially defined in the substrate 204 of microphone module 202. FIG. 27 illustrates a cross-sectional side view of the substrate 204 in an implementation in which an inductive filter 1600 is partially defined in the substrate 204, in accordance with one or more implementations.

As shown in FIG. 27, the substrate 204 may be a multi-layer substrate having one or more metal layers 2700, one or more insulating layers 2702, an insulating layer 2706, and a metal layer 2704. For example, the metal layers 2700 may be interconnected with each other (e.g., by one or more internal vias in the substrate) to form conductive pathways for operation of the microphone module 202. In one or more implementations, the metal layer 2704 may be electrically isolated from the metal layers 2700 by the insulating layer 2706, and may form a mask for formation of the channel 1906 in the insulating layer 2706. For example, the metal layer 2704 may be a patterned metal layer that forms an etch mask for etching (e.g., laser etching) the channel into the insulating layer 2706. As illustrated by the example of FIG. 26, in one or more implementations, the substrate 204 may be formed by a combination of patterning and laminating printed circuit board materials together so that the channel 1906 (e.g., an embedded serpentine channel) is formed therein. For example, the channel 1906 may be formed by a combination of patterning and laminating PCB materials together so that an embedded serpentine channel is formed in the resulting substrate. For example, the metal layer 2704 may be patterned and used as a mask for an etching process (e.g., laser etching or other etching process) that removes unmasked portions of the insulating layer 2706 and/or insulating layers 2702.

As shown, the cover 2400 (which may be an implementation of the cover 1604) may be attached to the metal layer 2704. For example, the adhesive material 2401 (which may be an implementation of the adhesive layer 1606) may be attached to the metal layer 2704 of the substrate 204 and may attach the cover 2400 thereto. In one or more implementations, the adhesive material 2401 may extend partially into the channel 1906 that is formed in the metal layer 2704 and the insulating layer 2706, as illustrated, for example, in FIG. 25. As shown, the opening 215 and the opening 209 in the substrate 204 may pass through the one or more metal layers 2700, the one or more insulating layers 2702, the metal layer 2704, and the insulating layer 2706. In one or more implementations, the insulating layers 2702 and/or the insulating layer 2706 may be formed, for example, from a glass-reinforced epoxy laminate material, such as FR4. In the example of FIG. 27, the first port 1902 is fluidly coupled to the opening 215 and the second port 1904 is fluidly coupled to the opening 209.

Figure 28:
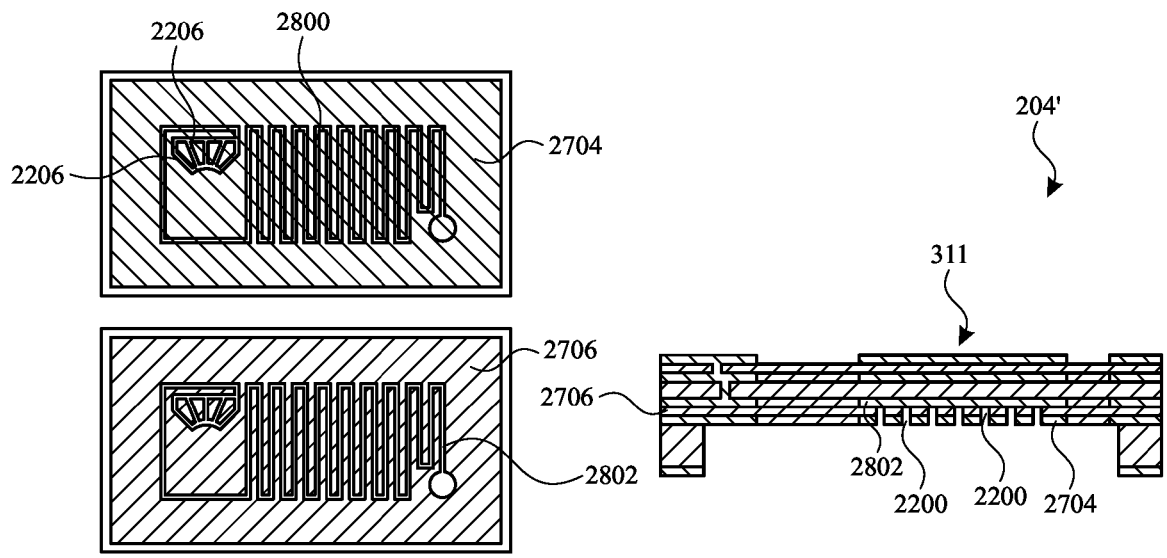
FIG. 28 illustrates aspects of metal layers of a microphone substrate including an embedded inductive vent in accordance with various aspects of the subject technology.

FIG. 28 illustrates an example of a partially manufactured state 204' of the substrate 204, at a stage when the insulating layers 2702 have not yet been removed to form the opening 215 and the opening 209. In FIG. 28, a bottom view of the metal layer 2704 is also shown, highlighting openings 2800 in the metal layer 2704 that form the openings in the channel 1906 that can be covered by the cover 2400. As shown, the metal layer 2704 of the substrate 204 may further define the multiple parallel input channels 2206 extending from the first port 1902 to the a serpentine fluid pathway formed by the channel 1906. In the example of FIG. 28, a bottom view of the insulating layer 2706 is also shown, and a portion of a metal layer 2802 of the substrate 204 is visible through the etched channel in the insulating layer 2706.

In accordance with one or more implementations, an inductive acoustic filter (e.g., inductive vent 600, inductive filter 1600, or inductive filter 1900) is provided that includes a substrate (e.g., substrate 204 or substrate 1909), an etched serpentine channel (e.g., channel 1602 or channel 1906) in a surface of the substrate and extending within the substrate from a first port 1902 in the substrate 204 to a second port 1904 in the substrate 204, and a polymer cover layer (e.g., cover 1604 or cover 2400) adhesively attached to the surface of the substrate over the etched serpentine channel. In one or more implementations, the polymer cover layer is adhesively attached to the surface of the substrate by an adhesive material (e.g., adhesive layer 1606 or adhesive material 2401) that includes a first portion that contacts the surface (e.g., the surface on side 1905) of the substrate and a second portion that extends into a portion of the etched serpentine channel (e.g., as shown in FIG. 25). In one or more implementations, the adhesive material includes a heat activated film. In one or more implementations, the polymer cover layer is formed from polyimide. In one or more implementations, the etched serpentine channel has a cross-sectional width 2409 and a length that is substantially larger than the cross-sectional width 2409. In this way, the inductive filter 1900 may act as a low pass acoustic filter.

In one or more implementations, the polymer cover layer includes an opening fluidly coupled to second port 1904 in the substrate. In one or more implementations, the polymer cover layer is configured for attachment to a microphone substrate (e.g., substrate 204) of a microphone module 202 with the opening in alignment with a leak port (e.g., opening 209) in the microphone substrate. In one or more other implementations, the substrate is the microphone substrate (e.g., substrate 204) of a microphone module 202. In one or more implementations, the inductive acoustic filter also includes multiple parallel input channels 2206 extending from the first port 1902 to the etched serpentine channel.

In one or more implementations, an electronic device 100 includes a housing 106 defining an internal volume 222, a microphone module 202 disposed within the internal volume 222. In one or more implementations, the microphone module 202 includes a substrate 204, a cover 208 mounted to the substrate 204, where the cover 208 separates a back volume 210 of the microphone module 202 from the internal volume 222. In one or more implementations, the microphone module 202 also includes a front volume 300 that is separated from the back volume 210 by a sound-responsive element 316 and that is fluidly coupled to a first opening (e.g., opening 215) in the substrate 204. In one or more implementations, the microphone module also includes a non-porous membrane 216 that defines a sealed volume 301 that is fluidly coupled to the front volume 300 via the first opening, and that provides a liquid-resistant seal between the front volume 300 and an environment 219 external to the housing 106. In one or more implementations, the microphone module also includes a second opening (e.g., opening 209) in the substrate that extends from the sealed volume 301 defined by the non-porous membrane 216, through the substrate 204, to the internal volume 222 of the housing 106 external to the cover 208. In one or more implementations, the electronic device 100 also includes at least one of a resistive filter (e.g., resistive vent 400 or a resistive filter disposed in a circuitry block 1000) or an inductive filter (e.g., inductive vent 600, inductive filter 1600, or inductive filter 1900) mounted over the second opening in the substrate.

In one or more implementations, a microphone module 202 includes a substrate 204, a cover 208 mounted to the substrate 204 and at least partially defining a back volume 210 of the microphone module 202, and a front volume 300 that is separated from the back volume 210 by a sound-responsive element 316 and that is fluidly coupled to a first opening (e.g., opening 215) in the substrate 204. In one or more implementations, the microphone module 202 also includes a non-porous membrane 216 that defines a sealed volume 301 that is fluidly coupled to the front volume 300 via the first opening, and that provides a liquid-resistant seal between the front volume 300 and a first environment (e.g., environment 219) external to the microphone module 202 on a first side (e.g., side 313) of the substrate 204. In one or more implementations, the microphone module 202 also includes a second opening (e.g., opening 209) in the substrate 204 that extends from the sealed volume 301 defined by the non-porous membrane 216, through the substrate 204, to a second environment (e.g., internal volume 222) external to the microphone module on an opposing second side (e.g., side 311) of the substrate 204. In one or more implementations, the microphone module 202 includes an inductive filter (e.g., inductive vent 600, inductive filter 1600, or inductive filter 1900) disposed between at least a portion of the non-porous membrane 216 and at least a portion of the substrate 204, the inductive filter having a first port 1902 coupled to the front volume 300, a second port 1904 coupled to the second opening in the substrate 204, and a serpentine fluid pathway (e.g., formed by the channel 1906) from the first port 1902 to the second port 1904.

In one or more implementations, the inductive filter is attached to the first side (e.g., side 313) of the substrate by an adhesive material (e.g., adhesive material 2401). In one or more implementations, the inductive filter is entirely disposed within the sealed volume 301 defined by the non-porous membrane 216 (e.g., as shown in FIGS. 7 and 11). In one or more implementations, the substrate 204 includes a recess 214, the inductive filter is attached to the substrate 204 within the recess 214, and the inductive filter spans substantially an entire width of the recess 214 (e.g., as in the examples of FIGS. 8, 9, 15, 16, and 27). In one or more implementations, the inductive filter further includes multiple parallel input channels 2206 extending from the first port 1902 to the serpentine fluid pathway.

In one or more implementations, a microphone module 202 may include a substrate 204, a cover 208 mounted to the substrate 204 and at least partially defining a back volume 210 of the microphone module 202, a front volume 300 that is separated from the back volume 210 by a sound-responsive element 316 and that is fluidly coupled to a first opening (e.g., opening 215) in the substrate 204, a non-porous membrane 216 that defines a sealed volume 301 that is fluidly coupled to the front volume 300 via the first opening, and that provides a liquid-resistant seal between the front volume 300 and a first environment (e.g., environment 219) external to the microphone module on a first side (e.g., side 313) of the substrate 204, a second opening (e.g., opening 209) in the substrate 204 that extends from the sealed volume 301 defined by the non-porous membrane 216, through the substrate 204, to a second environment (e.g., internal volume 222 of the electronic device 100) external to the microphone module 202 on an opposing second side (e.g., side 311) of the substrate; and an inductive filter (e.g., inductive filter 1600 or inductive filter 1900) at least partially defined in the substrate 204, the inductive filter having a first port 1902 coupled to the second opening, a second port 1904 coupled to the second environment, and a serpentine fluid pathway (e.g., defined by the channel 1906) within the substrate 204 from the first port 1902 to the second port 1904.

In one or more implementations, the serpentine fluid pathway is defined, in part, by a cover layer (e.g., cover 1604 or cover 2400) that is attached to the substrate 204 by an adhesive material (e.g., adhesive layer 1606 or adhesive material 2401). In one or more implementations, the adhesive material extends at least partially into the serpentine fluid pathway (e.g., as shown in FIG. 25). In one or more implementations, the substrate 204 is a multi-layer substrate having a metal layer 2704, and the adhesive material (e.g., adhesive layer 1606 or adhesive material 2401) is attached to the metal layer 2704 of the substrate 204. In one or more implementations, the metal layer 2704 of the substrate 204 further defines multiple parallel input channels 2206 extending from the first port 1902 to the serpentine fluid pathway.

In one or more implementations, an electronic device 100 includes a housing 106 defining an internal volume 222, a microphone module 202 disposed within the internal volume 222. In one or more implementations, the microphone module 202 includes a substrate 204, a cover 208 mounted to the substrate 204, the cover 208 separating a back volume 210 of the microphone module 202 from the internal volume 222, a front volume 300 that is separated from the back volume 210 by a sound-responsive element 316 and that is fluidly coupled to a first opening (e.g., opening 215) in the substrate 204, a non-porous membrane 216 that defines a sealed volume 301 that is fluidly coupled to the front volume 300 via the first opening, and that provides a liquid-resistant seal between the front volume 300 and an environment 219 external to the housing 106, a second opening (e.g., opening 209) in the substrate 204 that extends from the sealed volume 301 defined by the non-porous membrane 216, through the substrate 204, to the internal volume 222 of the housing external to the cover 208, and an inductive filter (e.g., inductive vent 600, inductive filter 1600, or inductive filter 1900) disposed between at least a portion of the non-porous membrane 216 and at least a portion of the substrate 204, the inductive filter having a first port 1902 coupled to the front volume 300, a second port 1904 coupled to the second opening in the substrate 204, and a serpentine fluid pathway (e.g., defined by the channel 1906) from the first port to the second port.

Figure 29:
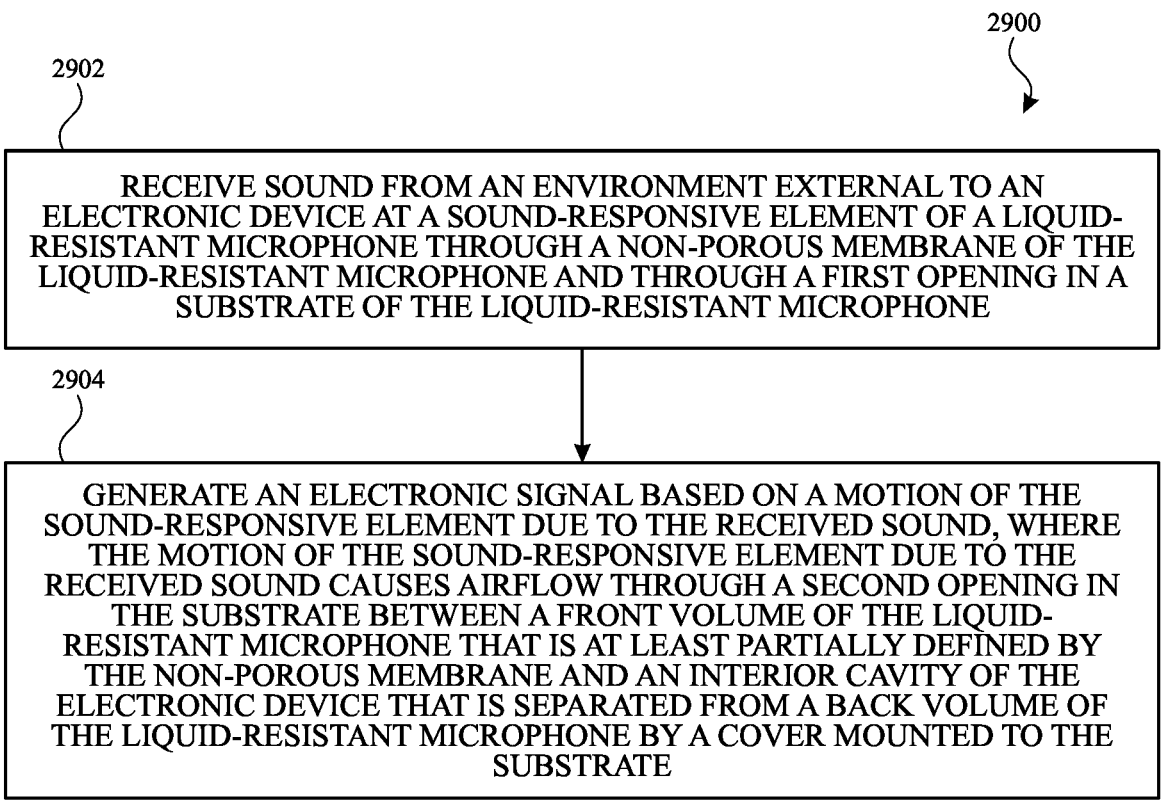
FIG. 29 illustrates a flowchart of illustrative operations that may be performed for operating a vented liquid-resistant microphone in accordance with various aspects of the subject technology.

FIG. 29 illustrates a flow diagram of an example process for operating a vented liquid-resistant microphone of an electronic device, in accordance with one or more implementations. For explanatory purposes, the process 2900 is primarily described herein with reference to the electronic device 100 and the microphone module 202 of FIGS. 1-28. However, the process 2900 is not limited to the electronic device 100 and the microphone module 202 of FIGS. 1-28, and one or more blocks (or operations) of the process 2900 may be performed by one or more other components and other suitable devices. Further for explanatory purposes, the blocks of the process 2900 are described herein as occurring in serial, or linearly. However, multiple blocks of the process 2900 may occur in parallel. In addition, the blocks of the process 2900 need not be performed in the order shown and/or one or more blocks of the process 2900 need not be performed and/or can be replaced by other operations.

In the example of FIG. 29, at block 2902, sound may be received from an environment (e.g., environment 219) external to an electronic device (e.g., electronic device 100) at a sound-responsive element (e.g., sound-responsive element 316) of the liquid-resistant microphone (e.g., microphone module 202) through a non-porous membrane (e.g., non-porous membrane 216) of the liquid-resistant microphone and through first opening (e.g., opening 215) in a substrate (e.g., substrate 204) of the liquid-resistant microphone.

At block 2904, an electronic signal may be generated based on a motion of the sound-responsive element due to the received sound. In one or more implementations, the motion of the sound-responsive element due to the received sound causes airflow (e.g., airflow 333) through a second opening (e.g., opening 209) in the substrate between a front volume (e.g., front volume 300) of the liquid-resistant microphone that is at least partially defined by the non-porous membrane and an interior cavity (e.g., internal volume 222 within the housing 106) of the electronic device that is separated from a back volume (e.g., back volume 210) of the liquid-resistant microphone by a cover (e.g., cover 208) mounted to the substrate.

In various implementations, the airflow passes through at least one of a resistive filter (e.g., a resistive vent 400 or a resistive filter mounted in a circuitry block 1000) or an inductive filter (e.g., inductive vent 600, inductive filter 1600, and/or inductive filter 1900) mounted over the second opening in the substrate, as described in, for example, any of FIGS. 3-16). In one or more implementations, a portion of the airflow may also pass through a third opening (e.g., opening 1500) in the substrate that fluidly couples the back volume and the front volume (e.g., as described in connection with FIG. 15).

In accordance with aspects of the subject disclosure, a microphone module is provided that includes a substrate; a cover mounted to the substrate and at least partially defining a back volume of the microphone module; a front volume that is separated from the back volume by a sound-responsive element and that is fluidly coupled to a first opening in the substrate; a non-porous membrane that defines a sealed volume that is fluidly coupled to the front volume via the first opening, and that provides a liquid-resistant seal between the front volume and a first environment external to the microphone module on a first side of the substrate; a second opening in the substrate that extends from the sealed volume defined by the non-porous membrane, through the substrate, to a second environment external to the microphone module on an opposing second side of the substrate; and an inductive filter disposed between at least a portion of the non-porous membrane and at least a portion of the substrate, the inductive filter having a first port coupled to the front volume, a second port coupled to the second opening in the substrate, and a serpentine fluid pathway from the first port to the second port.

In accordance with other aspects of the subject disclosure, a microphone module is provided that includes a substrate; a cover mounted to the substrate and at least partially defining a back volume of the microphone module; a front volume that is separated from the back volume by a sound-responsive element and that is fluidly coupled to a first opening in the substrate; a non-porous membrane that defines a sealed volume that is fluidly coupled to the front volume via the first opening, and that provides a liquid-resistant seal between the front volume and a first environment external to the microphone module on a first side of the substrate; a second opening in the substrate that extends from the sealed volume defined by the non-porous membrane, through the substrate, to a second environment external to the microphone module on an opposing second side of the substrate; and an inductive filter at least partially defined in the substrate, the inductive filter having a first port coupled to the second opening, a second port coupled to the second environment, and a serpentine fluid pathway within the substrate from the first port to the second port.

In accordance with other aspects of the subject disclosure, inductive acoustic filter is provided that includes a substrate; an etched serpentine channel in a surface of the substrate and extending within the substrate from a first port in the substrate to a second port in the substrate; and a polymer cover layer adhesively attached to the surface of the substrate over the etched serpentine channel.

In accordance with other aspects of the subject disclosure, inductive acoustic filter is provided that includes a substrate; a channel in a surface of the substrate and extending within the substrate from a first port in the substrate to a second port in the substrate; and a polymer cover layer adhesively attached to the surface of the substrate over the channel.

Various functions described above can be implemented in digital electronic circuitry, in computer software, firmware or hardware. The techniques can be implemented using one or more computer program products. Programmable processors and computers can be included in or packaged as mobile devices. The processes and logic flows can be performed by one or more programmable processors and by one or more programmable logic circuitry. General and special purpose computing devices and storage devices can be interconnected through communication networks.

Some implementations include electronic components, such as microprocessors, storage and memory that store computer program instructions in a machine-readable or computer-readable medium (alternatively referred to as computer-readable storage media, machine-readable media, or machine-readable storage media). Some examples of such computer-readable media include RAM, ROM, read-only compact discs (CD-ROM), recordable compact discs (CD-R), rewritable compact discs (CD-RW), read-only digital versatile discs (e.g., DVD-ROM, dual-layer DVD-ROM), a variety of recordable/rewritable DVDs (e.g., DVD-RAM, DVD-RW, DVD+RW, etc.), flash memory (e.g., SD cards, mini-SD cards, micro-SD cards, etc.), magnetic and/or solid state hard drives, ultra density optical discs, any other optical or magnetic media, and floppy disks. The computer-readable media can store a computer program that is executable by at least one processing unit and includes sets of instructions for performing various operations. Examples of computer programs or computer code include machine code, such as is produced by a compiler, and files including higher-level code that are executed by a computer, an electronic component, or a microprocessor using an interpreter.

While the above discussion primarily refers to microprocessor or multi-core processors that execute software, some implementations are performed by one or more integrated circuits, such as application specific integrated circuits (ASICs) or field programmable gate arrays (FPGAs). In some implementations, such integrated circuits execute instructions that are stored on the circuit itself.

As used in this specification and any claims of this application, the terms "computer", "processor", and "memory" all refer to electronic or other technological devices. These terms exclude people or groups of people. As used in this specification and any claims of this application, the terms "computer readable medium" and "computer readable media" are entirely restricted to tangible, physical objects that store information in a form that is readable by a computer. These terms exclude any wireless signals, wired download signals, and any other ephemeral signals.

To provide for interaction with a user, implementations of the subject matter described in this specification can be implemented on a computer having a display device as described herein for displaying information to the user and a keyboard and a pointing device, such as a mouse or a trackball, by which the user can provide input to the computer. Other kinds of devices can be used to provide for interaction with a user as well; for example, feedback provided to the user can be any form of sensory feedback, such as visual feedback, auditory feedback, or tactile feedback; and input from the user can be received in any form, including acoustic, speech, or tactile input.

Many of the above-described features and applications are implemented as software processes that are specified as a set of instructions recorded on a computer readable storage medium (also referred to as computer readable medium). When these instructions are executed by one or more processing unit(s) (e.g., one or more processors, cores of processors, or other processing units), they cause the processing unit(s) to perform the actions indicated in the instructions. Examples of computer readable media include, but are not limited to, CD-ROMs, flash drives, RAM chips, hard drives, EPROMs, etc. The computer readable media does not include carrier waves and electronic signals passing wirelessly or over wired connections.

In this specification, the term "software" is meant to include firmware residing in read-only memory or applications stored in magnetic storage, which can be read into memory for processing by a processor. Also, in some implementations, multiple software aspects of the subject disclosure can be implemented as sub-parts of a larger program while remaining distinct software aspects of the subject disclosure. In some implementations, multiple software aspects can also be implemented as separate programs. Finally, any combination of separate programs that together implement a software aspect described here is within the scope of the subject disclosure. In some implementations, the software programs, when installed to operate on one or more electronic systems, define one or more specific machine implementations that execute and perform the operations of the software programs.

A computer program (also known as a program, software, software application, script, or code) can be written in any form of programming language, including compiled or interpreted languages, declarative or procedural languages, and it can be deployed in any form, including as a stand alone program or as a module, component, subroutine, object, or other unit suitable for use in a computing environment. A computer program may, but need not, correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program can be deployed to be executed on one computer or on multiple computers that are located at one site or distributed across multiple sites and interconnected by a communication network.

It is understood that any specific order or hierarchy of blocks in the processes disclosed is an illustration of example approaches. Based upon design preferences, it is understood that the specific order or hierarchy of blocks in the processes may be rearranged, or that all illustrated blocks be performed. Some of the blocks may be performed simultaneously. For example, in certain circumstances, multitasking and parallel processing may be advantageous. Moreover, the separation of various system components in the aspects described above should not be understood as requiring such separation in all aspects, and it should be understood that the described program components and systems can generally be integrated together in a single software product or packaged into multiple software products.

In one aspect, a term coupled or the like may refer to being directly coupled. In another aspect, a term coupled or the like may refer to being indirectly coupled.

Terms such as top, bottom, front, rear, side, horizontal, vertical, and the like refer to an arbitrary frame of reference, rather than to the ordinary gravitational frame of reference. Thus, such a term may extend upwardly, downwardly, diagonally, or horizontally in a gravitational frame of reference.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language claims, wherein reference to an element in the singular is not intended to mean "one and only one" unless specifically so stated, but rather "one or more." Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the subject disclosure.

The predicate words "configured to", "operable to", and "programmed to" do not imply any particular tangible or intangible modification of a subject, but, rather, are intended to be used interchangeably. For example, a processor configured to monitor and control an operation or a component may also mean the processor being programmed to monitor and control the operation or the processor being operable to monitor and control the operation. Likewise, a processor configured to execute code can be construed as a processor programmed to execute code or operable to execute code A phrase such as an "aspect" does not imply that such aspect is essential to the subject technology or that such aspect applies to all configurations of the subject technology. A disclosure relating to an aspect may apply to all configurations, or one or more configurations. A phrase such as an aspect may refer to one or more aspects and vice versa. A phrase such as a "configuration" does not imply that such configuration is essential to the subject technology or that such configuration applies to all configurations of the subject technology. A disclosure relating to a configuration may apply to all configurations, or one or more configurations. A phrase such as a configuration may refer to one or more configurations and vice versa.

The word "example" is used herein to mean "serving as an example or illustration." Any aspect or design described herein as "example" is not necessarily to be construed as preferred or advantageous over other aspects or design.

All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112(f) unless the element is expressly recited using the phrase "means for" or, in the case of a method claim, the element is recited using the phrase "step for." Furthermore, to the extent that the term "include," "have," or the like is used in the description or the claims, such term is intended to be inclusive in a manner similar to the term "comprise" as "comprise" is interpreted when employed as a transitional word in a claim.

What is claimed is:

1. A microphone module, comprising:
    a substrate;
    a cover mounted to the substrate and at least partially defining a back volume of the microphone module,
    a front volume that is separated from the back volume by a sound-responsive element and that is fluidly coupled to a first opening in the substrate;
    a non-porous membrane that defines a sealed volume that is fluidly coupled to the front volume via the first opening, and that provides a liquid-resistant seal between the front volume and a first environment external to the microphone module on a first side of the substrate;
    a second opening in the substrate that extends from the sealed volume defined by the non-porous membrane, through the substrate, to a second environment external to the microphone module on an opposing second side of the substrate; and
    an inductive filter disposed between at least a portion of the non-porous membrane and at least a portion of the substrate, the inductive filter having a first port coupled to the front volume, a second port coupled to the second opening in the substrate, and a serpentine fluid pathway from the first port to the second port.

2. The microphone module of claim 1, wherein the inductive filter is attached to the first side of the substrate by an adhesive material.

3. The microphone module of claim 2, wherein the first port of the inductive filter is formed on a first side of the inductive filter, and the second port of the inductive filter is formed on an opposing second side of the inductive filter.

4. The microphone module of claim 2, wherein the first port and the second port of the inductive filter are both formed on a common side of the inductive filter.

5. The microphone module of claim 2, wherein the first port of the inductive filter is formed on an edge of the inductive filter, and the second port of the inductive filter is formed on a side of the inductive filter.

6. The microphone module of claim 2, wherein the inductive filter is entirely disposed within the sealed volume defined by the non-porous membrane.

7. The microphone module of claim 2, wherein the substrate comprises a recess, wherein the inductive filter is attached to the substrate within the recess, and wherein the inductive filter spans substantially an entire width of the recess.

8. The microphone module of claim 1, wherein the inductive filter comprises an opening extending through the inductive filter and wherein the serpentine fluid pathway extends around the opening without fluidly coupling with the opening.

9. The microphone module of claim 1, further comprising a resistive filter mounted to the opposing second side of the substrate, the resistive filter comprising:
   a frame having a central opening that is aligned with the second opening in the substrate of the microphone module; and
   a porous membrane spanning the central opening in the frame and extending over the second opening in the substrate.

10. The microphone module of claim 9, further comprising a circuitry block that includes at least one conductive via extending from a first contact pad on the opposing second side of the substrate, away from the substrate to a second contact pad on a top surface of the circuitry block.

11. The microphone module of claim 10, wherein the circuitry block comprises a main body that forms the frame of the resistive filter and encompasses the at least one conductive via.

12. A microphone module, comprising:
   a substrate;
   a cover mounted to the substrate and at least partially defining a back volume of the microphone module,
   a front volume that is separated from the back volume by a sound-responsive element and that is fluidly coupled to a first opening in the substrate;
   a non-porous membrane that defines a sealed volume that is fluidly coupled to the front volume via the first opening, and that provides a liquid-resistant seal between the front volume and a first environment external to the microphone module on a first side of the substrate;
   a second opening in the substrate that extends from the sealed volume defined by the non-porous membrane, through the substrate, to a second environment external to the microphone module on an opposing second side of the substrate; and
   an inductive filter at least partially defined in the substrate, the inductive filter having a first port coupled to the second opening, a second port coupled to the second environment, and a serpentine fluid pathway within the substrate from the first port to the second port.

13. The microphone module of claim 12, wherein the serpentine fluid pathway is defined, in part, by a cover layer that is attached to the substrate by an adhesive material.

14. The microphone module of claim 13, wherein the adhesive material extends at least partially into the serpentine fluid pathway.

15. The microphone module of claim 13, wherein the substrate comprises a multi-layer substrate having a metal layer, and wherein the adhesive material is attached to the metal layer of the substrate.

16. The microphone module of claim 15, wherein the metal layer of the substrate further defines multiple parallel input channels extending from the first port to the serpentine fluid pathway.

17. An inductive acoustic filter, comprising:
   a substrate;
   an etched serpentine channel in a surface of the substrate and extending within the substrate from a first port in the substrate to a second port in the substrate, the etched serpentine channel comprising a plurality of switchback segments; and
   a polymer cover layer adhesively attached to the surface of the substrate over the etched serpentine channel.

18. The inductive acoustic filter of claim 17, wherein the polymer cover layer is adhesively attached to the surface of the substrate by an adhesive material that includes a first portion that contacts the surface of the substrate and a second portion that extends into each of the plurality of switchback segments of the etched serpentine channel.

19. The inductive acoustic filter of claim 18, wherein the adhesive material comprises a heat activated film.

20. The inductive acoustic filter of claim 19, wherein the polymer cover layer is formed from polyimide.

21. The inductive acoustic filter of claim 17, wherein the etched serpentine channel has a width and a length that is at least ten times larger than the width.

22. The inductive acoustic filter of claim 17, wherein the polymer cover layer comprises an opening fluidly coupled to second port in the substrate.

23. The inductive acoustic filter of claim 22, wherein the polymer cover layer is configured for attachment to a microphone substrate of a microphone module with the opening in alignment with a leak port in the microphone substrate.

24. The inductive acoustic filter of claim 17, wherein the substrate comprises a microphone substrate of a microphone module.

25. The inductive acoustic filter of claim 17, further comprising multiple parallel input channels extending from the first port to the etched serpentine channel.

26. The inductive acoustic filter of claim 17, wherein each of the plurality of switchback segments of the etched serpentine channel is formed by an open channel within the substrate, the open channel having two opposing sidewalls, a bottom wall that extends between the two opposing sidewalls, and an open top, and wherein the polymer cover layer is adhesively attached to the surface of the substrate to close the open channel by forming a top wall of a pathway formed by the etched serpentine channel.

* * * * *